United States Patent
Biagini et al.

(10) Patent No.: US 9,865,403 B2
(45) Date of Patent: Jan. 9, 2018

(54) ORGANIC DYE FOR A DYE SENSITIZED SOLAR CELL

(71) Applicant: ENI S.p.A., Rome (IT)

(72) Inventors: Paolo Biagini, San Giuliano Terme (IT); Alessandro Abbotto, Milan (IT); Norberto Manfredi, Cassina de' Pecchi (IT)

(73) Assignee: ENI S.p.A., Rome (IT)

( * ) Notice: Subject to any disclaimer, the term of this patent is extended or adjusted under 35 U.S.C. 154(b) by 36 days.

(21) Appl. No.: 14/759,778

(22) PCT Filed: Feb. 13, 2014

(86) PCT No.: PCT/IB2014/058970
§ 371 (c)(1),
(2) Date: Jul. 8, 2015

(87) PCT Pub. No.: WO2014/125432
PCT Pub. Date: Aug. 21, 2014

(65) Prior Publication Data
US 2016/0012976 A1    Jan. 14, 2016

(30) Foreign Application Priority Data
Feb. 14, 2013 (IT) ............... MI2013A0208

(51) Int. Cl.
*C09B 57/00* (2006.01)
*H01G 9/20* (2006.01)
*H01L 51/00* (2006.01)
*C09B 23/10* (2006.01)
*C09B 23/14* (2006.01)
*C09B 1/00* (2006.01)
*C09B 23/01* (2006.01)
*C09B 29/40* (2006.01)

(52) U.S. Cl.
CPC ............ *H01G 9/2059* (2013.01); *C09B 1/00* (2013.01); *C09B 23/0075* (2013.01); *C09B 23/105* (2013.01); *C09B 23/14* (2013.01); *C09B 23/141* (2013.01); *C09B 29/3608* (2013.01); *C09B 57/00* (2013.01); *C09B 57/001* (2013.01); *C09B 57/008* (2013.01); *H01G 9/2027* (2013.01); *H01L 51/006* (2013.01); *H01L 51/0061* (2013.01); *H01L 51/0067* (2013.01); *H01G 9/2031* (2013.01); *Y02E 10/542* (2013.01); *Y02E 10/549* (2013.01)

(58) Field of Classification Search
None
See application file for complete search history.

(56) References Cited

U.S. PATENT DOCUMENTS 7,569,704 B1   8/2009  Lin et al.
2012/0060927 A1 *  3/2012  Onaka .............. H01L 51/0036
                                                            136/263

FOREIGN PATENT DOCUMENTS

| CN | 1441969 A    | 9/2003 |
| CN | 1762068 A    | 4/2006 |
| CN | 101407639 A  | 4/2009 |
| CN | 102604415 A  | 7/2012 |
| EP | 2 053 618 A1 | 4/2009 |

OTHER PUBLICATIONS

International Search Report and Written Opinion dated Apr. 24, 2014 in PCT/IB2014/058970.
Sanghoon Kim, et al., "Synthesis of conjugated organic dyes containing alkyl substituted thiophene for solar cell" Tetrahedron, vol. 63, No. 46, XP022284178, 2007, pp. 11436-11443.
Office Action dated Mar. 31, 2017 in Chinese Patent Application No. 21480007140.X (with English translation).
Daniel P. Hagberg, et al., "A novel organic chromophore for dye-sensitized nanostructured solar cells", chem. communication, 2006, pp. 2245-2247.
Qianqian Li, et al., "New Pyrrole-Based Organic Dyes for Dye-Sensitized Solar Cells: Convenient Syntheses and High Efficiency", Communication, 2009, 1 page (Abstract).
Antonio Facchetti, et al., "Azinium-( π-Bridge)-Pyrrole NLO-Phores: Influence of Heterocycle Acceptors on Chromophoric and Self-Assembled Thin-Film properties", American Chemical Society, 2002, pp. 4996-5005.

* cited by examiner

*Primary Examiner* — Joseph R Kosack
(74) *Attorney, Agent, or Firm* — Oblon, McClelland, Maier & Neustadt, L.L.P.

(57) ABSTRACT

Organic dye for a dye sensitized solar cell (DSSC) comprising at least one substituted pyrrole group. Said organic dye is particularly useful in a dye sensitized photoelectric transformation element which, in its turn, can be used in a dye sensitized solar cell (DSSC).

12 Claims, No Drawings

ORGANIC DYE FOR A DYE SENSITIZED SOLAR CELL

The present invention relates to an organic dye for a dye sensitized solar cell (DSSC).

More specifically, the present invention relates to an organic dye for a dye sensitized solar cell (DSSC) comprising at least one substituted pyrrole group.

Said organic dye is particularly useful in a dye sensitized photoelectric transformation element which, in its turn, can be used in a dye sensitized solar cell (DSSC).

Consequently, a further object of the present invention relates to a dye sensitized photoelectric transformation element comprising at least one organic dye reported above, in addition to a dye sensitized solar cell (DSSC) comprising said photoelectric transformation element.

Dye sensitized solar cells (DSSCs) were developed by Grätzel M. et al. in 1991 and they have attracted considerable attention in recent years as they represent one of the photovoltaic conversion methods of solar light having the greatest potentiality in terms of photoelectric transformation efficiency ($\eta$) and in terms of production costs.

Further details relating to dye sensitized solar cells (DSSCs) can be found, for example, in: Kalyanasundaram K., "*Dye-Sensitized Solar Cells*" (2010), CRC Press Inc., 1$^a$ Edition; Elliott, C. M., "*Nature Chemistry*" (2011), Vol. 3, pages 188-189; Hagfeldt A. et al. "*Chemical Reviews*" (2010), Vol. 110, pages 6595-6663; Grätzel M., "*Nature*" (2001), Vol. 414, pages 338-344.

Dye sensitized solar cells (DSSCs) generally comprise four main components: an optically transparent electrode (anode); an organic or organometallic molecule, called dye or photosensitizer (hereinafter indicated as dye), adsorbed on a semiconductor oxide, typically on mesoporous nanocrystalline titanium dioxide ($TiO_2$); a liquid inorganic electrolyte or a solid organic hole-transporting material; and a counter-electrode (cathode). The dye is photochemically excited when it absorbs solar light and in this way, its electrons move to an orbital with a higher energy (LUMO or dye excited state) from which they are transferred to the conduction band of the semi-conductor oxide [i.e. titanium dioxide ($TiO_2$)], leaving the dye molecules in their oxidized form. The electrons are then collected on a transparent conductive layer, normally consisting of tin dioxide ($SnO_2$) doped with fluorine ("Fluorine-doped Tin Oxide—FTC)) and reach the counter-electrode (cathode) through an external electric circuit. The oxidized molecules of the dye are regenerated as follows: through a transfer catalyzed by platinum (Pt), deposited on the cathode, the electrons trigger a series of redox reactions mediated through a redox pair which acts as an electrolyte (typically the pair iodide/triiodide), at the end of said reactions, the redox pair in reduced form transfers an electron to the dye, which had remained in oxidized form, regenerating it and closing the cycle.

The dye represents one of the main components of dye sensitized solar cells (DSSCs) as it has the function of collecting solar light and of transforming it into a current of electrons. In order to have solar cells with high photoelectric transformation efficiencies ($\eta$), the dye must have optimum optical absorption properties, i.e. a wide absorption spectrum of solar light and a high molar extinction coefficient ($\epsilon$).

So far, the most widely-used organic dyes, which have allowed high photoelectric transformation efficiencies ($\eta$) to be reached (i.e. photoelectric transformation efficiencies ($\eta$) higher than 11%) are organometallic compounds typically based on ruthenium complexes in oxidation state 2+ [Ru(II)]. In spite of recent progresses (see, for example, Abbotto A. et al., "*Dalton Transaction*" (2011), Vol. 40, pages 12421-12438), said compounds, however, have various drawbacks such as, for example: a low molar extinction coefficient ($\epsilon$) inherent to derivatives of ruthenium [Ru(II)]; difficulties in synthesis and purification (they require, in fact, an accurate synthesis and complex purification phases); high costs for both the synthesis and also ruthenium itself; a limited chemical stability.

For the above reasons, metal-free organic dyes have recently been proposed as an alternative, as described for example, in: Yen Y.-S. et al., "*Journal of Materials Chemistry*" (2012), Vol. 22, pages 8734-8747; Mishra A. et al., in "*Angewandte Chemie*" (2009), Vol. 48, pages 2474-2499. Said metal-free organic dyes have various advantages with respect to organometallic dyes, among which: a higher structural variety; a simpler and less expensive synthesis (for example, the purification can be carried out using standard methods adopted in organic chemistry); presence of a chemical industry already capable of carrying out their synthesis on a large scale; and, above all, good optical absorption properties, i.e. the possibility of obtaining, through a suitable design, wide absorption spectra of solar light and high molar extension coefficients ($\epsilon$). However, with the exception of only one example in which a metal-free organic dye, mixed with a metal-porphyrin (i.e. a zinc porphyrin) has allowed, in the presence of electrolytes suitably designed and with questionable applicability [e.g. a redox electrolyte based on $Co^{(II/III)}$tris(bipyridyl)], a photoelectric transformation efficiency ($\eta$) of 12.3% to be obtained [as reported by Yella A. et al., "*Science*" (2011), Vol. 334, pages 629-634], metal-free organic dyes have allowed Dye Sensitized Solar Cells (DSSCs) to be obtained, having photoelectric transformation efficiencies ($\eta$) lower than those obtained using organic dyes containing metals.

Further studies have in fact been carried out in order to find metal-free organic dyes showing improved optical absorption properties.

The structure of metal-free organic dyes is usually of the linear D-$\pi$-A type, wherein D is an electron donor group (i.e. electron-rich), $\pi$ is an unsaturated spacer having $\pi$-conjugated bonds and A is an electron acceptor group (i.e. electron-poor) to which a group is bound which allows the anchoring (i.e. adsorption) of the dyes on titanium dioxide (typically, a COOH group).

In *Energy & Environmental Science*" (2009), Vol. 2, pages 1094-1101, Abbotto A. et al. described metal-free organic dyes for dye sensitized solar cells (DSSCs) with a multi-branched structure, comprising an electron donor group D chemically bound to two branches of the $\pi$-A type, wherein $\pi$ is an unsaturated spacer with $\pi$-conjugated bonds and A is an electron acceptor group, each group A carrying the carboxylic function necessary for anchorage on the titanium dioxide. In other words, there is a shift from a geometry of the linear type (i.e. D-$\pi$-A) to a geometry of the branched type. Said branched-type geometry on the one hand allows to have a more extended $\pi$-conjugated system, and consequently a more efficient absorption of the solar spectrum, and on the other hand, to contain, by means of the two groups A, two channels (instead of only one channel, typical of other organic dyes) for transferring the electrons from the excited state of the dye to the conduction band of the titanium dioxide (similar to organometallic dyes having from 2 to 4 groups A). The above organic dyes show an improvement not only in the optical absorption properties, but also in the chemical stability, with respect to the corresponding linear structures. As far as the photoelectric transformation efficiency (η) is concerned, however, the above organic dyes do not always provide good results.

In spite of the wide variety and large number of organic dyes so far reported, their overall structures are almost exclusively based on the presence of electron donor groups D of the triarylamine type ($NAr_3$), as described, for example, by Ning Z. et al., in "*Chemical Communications*" (2009), Vol. 37, pages 5483-5495, and on the presence of π spacers based on thiophene structures such as, for example, fused monocyclic and polycyclic thiophene rings, as described, for example, by: Xu M. et al., in "*Journal of Physical Chemistry C*" (2009), Vol. 113, pages 2966-2973; Zhang G. et al., in "*Chemical Communications*" (2009), Vol. 1, Issue 16, pages 2198-2200; Zeng W. et al., in "*Chemistry of Materials*" (2010), Vol. 22, pages 1915-1925.

Other electron-rich groups, however, are present in organic chemistry, i.e. electron donor groups D, which could therefore be successfully inserted in D-π-A structures instead of the triarylamine group. Among intrinsically electron-rich aromatic groups which could be used as electron donor groups, there are, for example, pentatomic monoheteroaromatic rings, described, for example, by Katritzky A. R. et al., in "*Handbook of Heterocyclic Chemistry*" (1983), Pergamon Press, Oxford; or by Albert A., "*Heterocyclic Chemistry*" (1968), Oxford University Press, New York. These aromatic groups have electron-donor characteristics also in the absence of further electron-rich substituents such as, for example, alkoxyl or amine groups, as, on the other hand, in the case of triarylamines. Among these aromatic groups, the most electron-rich aromatic ring is pyrrole, thanks to the presence of a nitrogen atom $sp^2$ carrying an electronic doublet on an orbital 2p (of the π type) which is shared with the π aromatic system of the cycle.

In spite of the numerous efforts made, the study of new metal-free organic dyes capable of giving dye sensitized solar cells (DSSCs) having a modulation within the absorption spectrum, i.e. the possibility of being able to choose a different colouring of the device in relation to the application type, a good duration with time, i.e. a duration of at least 5 years, and a good photoelectric transformation efficiency (η), i.e. a photoelectric transformation efficiency (η) higher than or equal to 3.5%, is still of great interest.

The Applicant has therefore considered the problem of finding an organic dye capable of satisfying the requirements mentioned above and, in particular, of giving dye sensitized solar cells (DSSCs) having a good photoelectric transformation efficiency (η), i.e. a photoelectric transformation efficiency (η) higher than or equal to 3.5%.

The Applicant has now found an organic dye comprising at least one substituted pyrrole group, which is capable of providing a dye sensitized solar cell (DSSC) having a good photoelectric transformation efficiency (η), i.e. a photoelectric transformation efficiency (η) higher than or equal to 3.5%, and with open-circuit photovoltage (Voc), short-circuit current density (Jsc) and Fill Factor (FF) values, comparable to those of organometallic dyes known in the art.

It should be pointed out that said substituted pyrrole group can have the role of both electron donor group and also the role of π-conjugated unit.

An object of the present invention therefore relates to an organic dye having general formula (I):

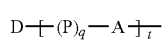

(I)

wherein:

D represents a triarylamine group having the following general formulae (II), (III), (IV), (V), (VI), (VII), (VIII), (IX), (X), (XI), (XII), (XIII), (XIV), (XV), (XVI):

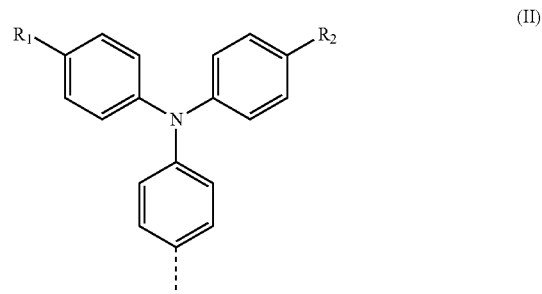

(II)

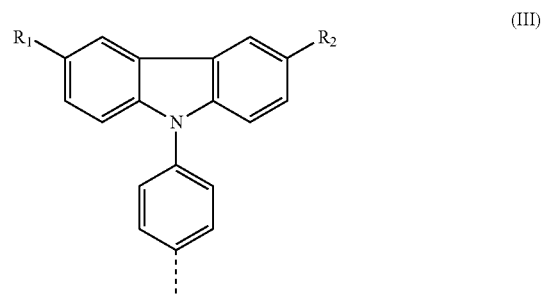

(III)

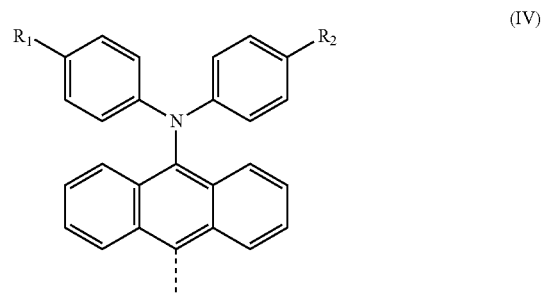

(IV)

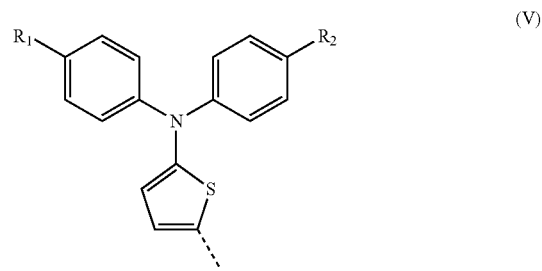

(V)

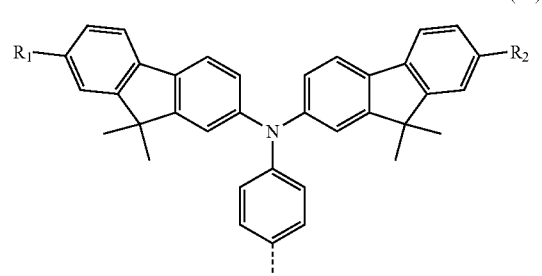

(VI)

(VII) 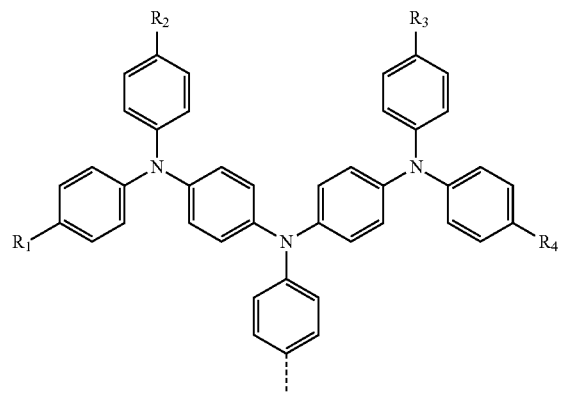
(VIII) 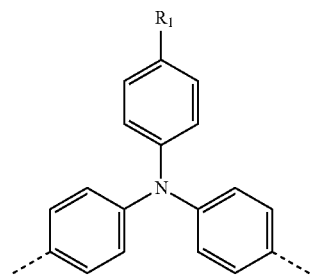
(IX) 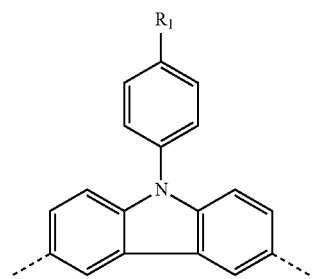
(X) 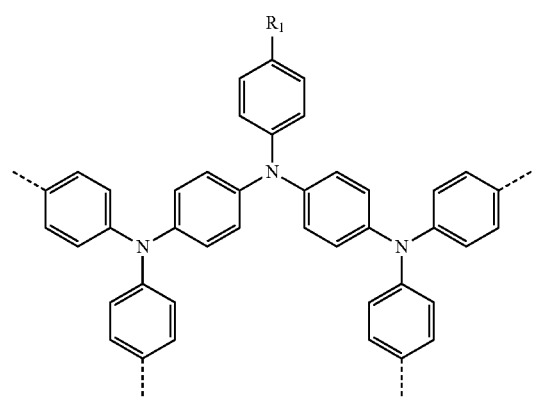
(XI) 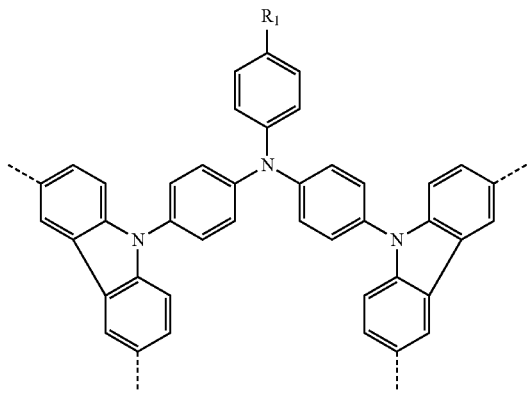
(XII) 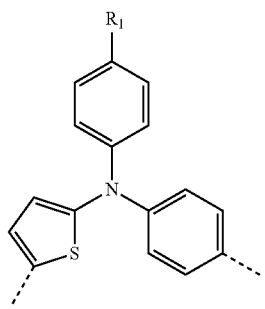
(XIII) 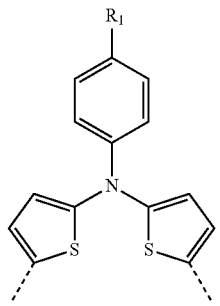
(XIV) 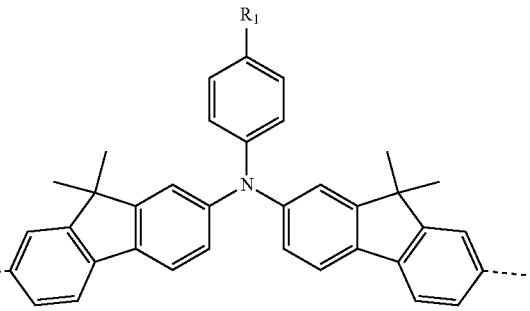

(XV)
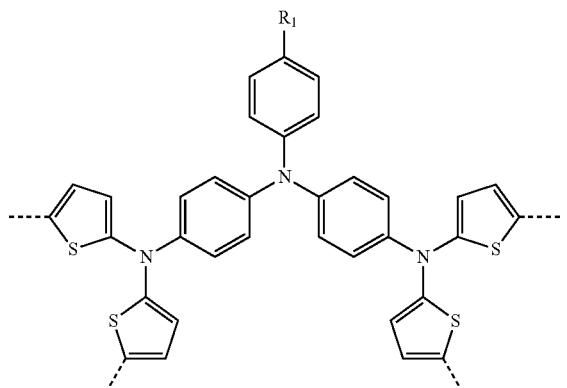

(XVI)
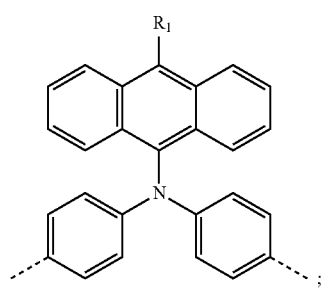

or D represents a pyrrole group having the following general formulae (XVII), (XVIII), (XIX), (XX), (XXI), (XXII), (XXIII), (XXIV), (XXV), (XXVI):

(XVII)
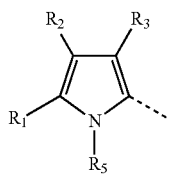

(XVIII)
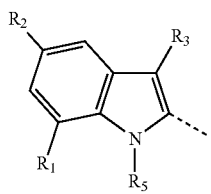

(XIX)
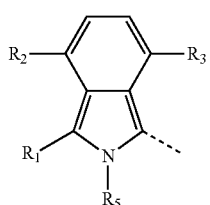

(XX)
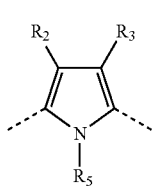

(XXI)
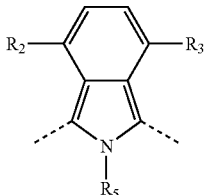

(XXII)
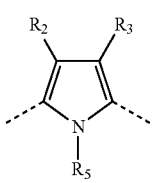

(XXIII)
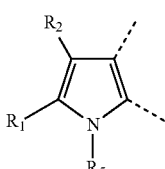

(XXIV)
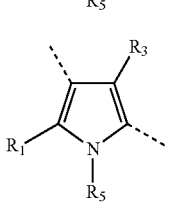

(XXV)
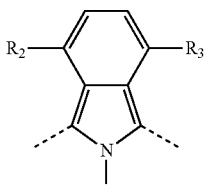

(XXVI)
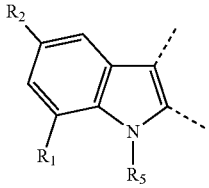

wherein $R_1$, $R_2$, $R_3$ and $R_4$, equal to or different from each other, represent a hydrogen atom; or they represent a halogen atom such as, for example, fluorine, chlorine or bromine, preferably fluorine or bromine; or they are selected from linear or branched $C_1$-$C_{20}$, preferably $C_1$-$C_{12}$, alkyl groups, saturated or unsaturated, optionally containing heteroatoms, aryl groups optionally substituted, heteroaryl groups optionally substituted, cycloalkyl groups optionally substituted, heterocyclic groups optionally substituted, trialkyl- or triaryl-silyl groups, dialkyl- or diaryl-amine groups, dialkyl- or diaryl-phosphine groups, linear or branched $C_1$-$C_{20}$, preferably $C_2$-$C_{10}$, alkoxyl groups, saturated or unsaturated, aryloxyl groups optionally substituted, thioalkoxyl or thioaryloxyl groups optionally substituted, polyethyleneoxyl groups having formula R'—O—[—CH$_2$—CH$_2$—O]$_m$— wherein R' represents a hydrogen atom, or it is selected from linear or branched $C_1$-$C_{20}$, preferably $C_1$-$C_{12}$, alkyl groups, and m è is an integer ranging from 1 to 20, preferably ranging from 2 to 10;

$R_5$ represents a hydrogen atom; or it is selected from linear or branched $C_1$-$C_{20}$, preferably $C_1$-$C_{12}$, alkyl groups, saturated or unsaturated, optionally containing heteroatoms, aryl groups optionally substituted, cycloalkyl groups optionally substituted;

q is 0 or 1;

when q is 1, P represents one of the following general formulae (Ia), (Ib), (Ic), (Id):

-(T)$_n$-(P$_1$)$_m$—(P$_2$)$_r$—(P$_3$)$_s$— (Ia)

—(P$_1$)$_m$-(T)$_n$-(P$_2$)$_r$—(P$_3$)$_s$— (Ib)

—(P$_1$)$_m$—(P$_2$)$_r$-(T)$_n$-(P$_3$)$_s$— (Ic)

—(P$_1$)$_m$—(P$_2$)$_r$—(P$_3$)$_s$-(T)$_n$- (Id)

wherein:

T represents a triple carbon-carbon bond having formula (XXVII), or a double carbon-carbon bond having general formula (XXVIII) or (XXIX), or a double nitrogen-nitrogen bond having general formula (XXX):

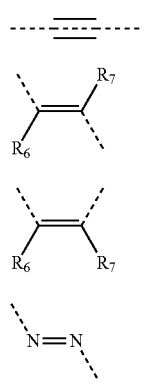

(XXVII)

(XXVIII)

(XXIX)

(XXX)

wherein $R_6$ and $R_7$, equal to or different from each other, represent a hydrogen atom; or they are selected from linear or branched $C_1$-$C_{20}$, preferably $C_1$-$C_{12}$, alkyl groups, saturated or unsaturated, optionally containing heteroatoms, aryl groups optionally substituted, heteroaryl groups optionally substituted, cycloalkyl groups optionally substituted;

n is an integer ranging from 0 to 5, and is preferably 0 or 1;

$P_1$, $P_2$ and $P_3$, equal to or different from each other, represent a bivalent pyrrole group having general formula (XX), (XXI), (XXII), (XXIII), (XXIV), (XXV) or (XXVI), defined above, or they are selected from bivalent heteroaryl or aryl groups having the following general formulae (XXXI), (XXXII), (XXXIII), (XXXIV), (XXXV), (XXXVI), (XXXVII), (XXXVIII), (XXXIX), (XL), (XLI), (XLII), (XLIII):

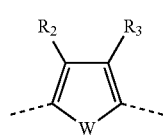

(XXXI)

(XXXII)

(XXXIII)

(XXXIV)

(XXXV)

(XXXVI)

(XXXVII)

(XXXVIII)

(XXXIX)

(XL)

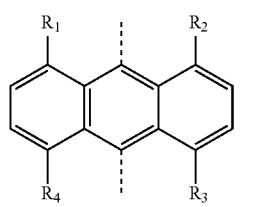
(XLI)

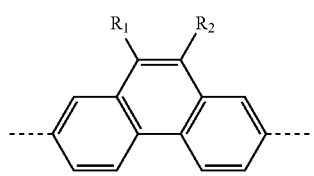
(XLII)

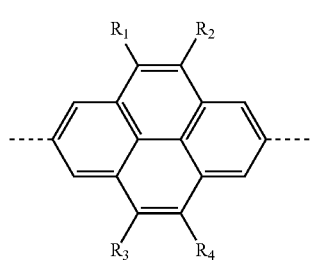
(XLIII)

wherein
- $R_1$, $R_2$, $R_3$ and $R_4$, equal to or different from each other, have the meaning defined above;
- Z represents a heteroatom such as, for example, oxygen, sulfur, selenium, tellurium, preferably sulfur; or it is selected from groups having general formula $X(R_8)$ or from groups having general formula $Y(R_9R_{10})$, wherein $R_8$, $R_9$ and $R_{10}$, have the meanings defined hereunder, X represents a heteroatom such as, for example, nitrogen, phosphorous, arsenic, boron, preferably nitrogen, Y represents a carbon, silicon or germanium atom, preferably silicon or carbon;
- W represents a heteroatom such as, for example, oxygen, sulfur, selenium, tellurium, preferably sulfur; or it is selected from groups having general formula $Y(R_9R_{10})$, wherein $R_9$ and $R_{10}$, have the meanings defined hereunder, Y represents a carbon, silicon or germanium atom, preferably silicon or carbon;
- $R_8$ represents a hydrogen atom; or it is selected from linear or branched $C_1$-$C_{20}$, preferably $C_1$-$C_{12}$, alkyl groups, saturated or unsaturated, optionally containing heteroatoms, aryl groups optionally substituted, cycloalkyl groups optionally substituted;
- $R_9$ and $R_{10}$, equal to or different from each other, are selected from linear or branched $C_1$-$C_{20}$, preferably $C_1$-$C_{12}$, alkyl groups, saturated or unsaturated, optionally containing heteroatoms, aryl groups optionally substituted, cycloalkyl groups optionally substituted, linear or branched $C_1$-$C_{20}$, preferably $C_1$-$C_{10}$, alkoxyl groups, saturated or unsaturated, aryloxyl groups optionally substituted, thioalkoxyl or thioaryloxyl groups optionally substituted;
- or $R_1$ and $R_2$ in general formulae (XVII), (XXXIX), (XLII) or (XLIII), or $R_2$ and $R_3$ in general formulae (XVII), (XXII), (XXXI), (XXXIII) or (XXXV), or $R_3$ and $R_4$ in general formula (XLIII), or $R_1$ and $R_5$ in general formula (XXIII), can be optionally bound to each other so as to form, together with the other atoms to which they are bound, a cycle containing from 1 to 12 carbon atoms, saturated, unsaturated, or aromatic, optionally substituted with linear or branched $C_1$-$C_{20}$ alkyl groups, saturated or unsaturated, optionally containing heteroatoms, aryl groups optionally substituted, heteroaryl groups optionally substituted, cycloalkyl groups optionally substituted, heterocyclic groups optionally substituted, trialkyl- or triaryl-silyl groups, dialkyl- or diaryl-amine groups, dialkyl- or diaryl-phosphine groups, linear or branched $C_1$-$C_{20}$, preferably $C_2$-$C_{10}$, alkoxyl groups, saturated or unsaturated, aryloxyl groups optionally substituted, thioalkoxyl or thioaryloxyl groups optionally substituted, cyano groups, said cycle optionally containing heteroatoms such as, for example, oxygen, sulfur, nitrogen, silicon, phosphorous, selenium;
- m, r and s, equal to or different from each other, are an integer ranging from 0 to 5, and are preferably 0 or 1, with the proviso that at least one of m, r and s is different from 0;
- A represents a —COOH group; a phosphonic group having formula —$PO(OH)_2$ or —$PO(OH)(R)$ wherein R is selected from linear or branched $C_1$-$C_{20}$, preferably $C_1$-$C_{10}$, alkyl groups; a carboxycyanovinylene group having general formula (XLIV) or (XLV):

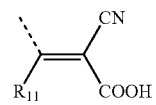
(XLIV)

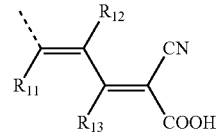
(XLV)

wherein $R_{11}$, $R_{12}$ and $R_{13}$, equal to or different from each other, represent a hydrogen atom; or they represent a halogen atom such as, for example, fluorine, chlorine or bromine, preferably fluorine or bromine; or they are selected from linear or branched $C_1$-$C_{20}$, preferably $C_1$-$C_{12}$, alkyl groups, saturated or unsaturated, optionally containing heteroatoms, aryl groups optionally substituted, heteroaryl groups optionally substituted, cycloalkyl groups optionally substituted, cyano groups, nitro groups;

t is an integer ranging from 1 to 6, and is preferably 1 or 2;

with the proviso that in said general formula (I) there is at least one pyrrole group having general formula (XVII), (XVIII), (XIX), (XX), (XXI), (XXII), (XXIII), (XXIV), (XXV) or (XXVI), defined above.

For the aim of the present description and of the following claims, the definition of the numerical ranges always include the extremes unless otherwise specified.

For the aim of the present description and of the following claims, the term "comprising" also includes the wording "which essentially consists of" or "which consists of".

The term "$C_1$-$C_{20}$ alkyl groups" means alkyl groups having from 1 to 20 carbon atoms, linear or branched, saturated or unsaturated. Specific examples of $C_1$-$C_{20}$ alkyl groups are: methyl, ethyl, n-propyl, iso-propyl, n-butyl, iso-butyl, t-butyl, pentyl, hexyl, heptyl, octyl, 2-ethylheptyl, 2-ethylhexyl, 2-butenyl, 2-pentenyl, 2-ethyl-3-hexenyl, 3-octenyl, 1-methyl-4-hexenyl, 2-butyl-3-hexenyl.

The term "$C_1$-$C_{20}$ alkyl groups optionally containing heteroatoms" means alkyl groups having from 1 to 20 carbon atoms, linear or branched, saturated or unsaturated, wherein at least one of the hydrogen atoms is substituted with a heteroatom selected from: halogens such as, for example, fluorine, chlorine, bromine, preferably fluorine; nitrogen; sulfur; oxygen. Specific examples of $C_1$-$C_{20}$ alkyl groups optionally containing heteroatoms are: fluoromethyl, difluoromethyl, trifluoromethyl, trichloromethyl, 2,2,2-trifluoroethyl, 2,2,2-trichloroethyl, 2,2,3,3-tetrafluoropropyl, 2,2,3,3,3-pentafluoropropyl, perfluoropentyl, perfluorooctyl, perfluorodecyl, oxymethyl, thiomethyl, thyoethyl, dimethylamino, propylamino, dioctylamino.

The term "aryl groups" means aromatic carbocyclic groups containing from 6 to 60 carbon atoms. Said aryl groups can be optionally substituted with one or more groups, equal to or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyethyleneoxyl groups; cyano groups; amino groups; $C_1$-$C_{12}$ mono- or di-alkylamine groups; nitro groups. Specific examples of aryl groups are: phenyl, methyphenyl, trimethylphenyl, methoxyphenyl, hydroxyphenyl, phenyloxyphenyl, fluorophenyl, pentafluorophenyl, chlorophenyl, bromophenyl, nitrophenyl, dimethylaminophenyl, naphthyl, phenylnaphthyl, phenanthrene, anthracene.

The term "heteroaryl groups" means penta- or hexaatomic aromatic heterocyclic groups, also benzocondensed or heterobicyclic, containing from 4 to 60 carbon atoms and from 1 to 14 heteroatoms selected from nitrogen, oxygen, sulfur, silicon, selenium, phosphorous. Said heteroaryl groups can be optionally substituted with one or more groups, equal to or different from each other, selected from: halogen atoms such as, for example fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyethyleneoxyl groups; cyano groups; amino groups; $C_1$-$C_{12}$ mono- or di-alkylamine groups; nitro groups. Specific examples of heteroaryl groups are: pyridine, methylpyridine, methoxypyridine, phenylpyridine, fluoropyridine, pyrimidine, pyridazine, pyrazine, triazine, tetrazine, quinoline, quinoxaline, quinazoline, furan, thiophene, hexylthiophene, bromothiophene, dibromothiophene, pyrrole, oxazole, triazole, isooxazole, isothiazole, oxadiazole, thiadiazole, pyrazole, imidazole, triazole, tetrazole, indole, benzofuran, benzothiophene, benzoxazole, benzothiazole, benzooxadiazole, benzothiadiazole, benzopyrazole, benzimidazole, benzotriazole, triazolepyridine, triazolepyrimidine, coumarin.

The term "cycloalkyl groups" means cycloalkyl groups having from 3 to 60 carbon atoms. Said cycloalkyl groups can be optionally substituted with one or more groups, equal to or different from each other, selected from: halogen atoms such as, for example fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyethyleneoxyl groups; cyano groups; amino groups; $C_1$-$C_{12}$ mono- or di-alkylamine groups; nitro groups. Specific examples of cycloalkyl groups are: cyclopropyl, 2,2-difluorocyclopropyl, cyclobutyl, cyclopentyl, cyclohexyl, methylcyclohexyl, methoxycyclohexyl, fluorocyclohexyl, phenylcyclohexyl, decalin, abietyl.

The term "heterocyclic groups" means rings having from 3 to 12 atoms, saturated or unsaturated, containing at least one heteroatom selected from nitrogen, oxygen, sulfur, selenium, phosphorous, optionally condensed with other aromatic or non-aromatic rings. Said heterocyclic groups can be optionally substituted with one or more groups, equal to or different from each other, selected from: halogen atoms, such as, for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ tri-alkylsilyl groups; polyethyleneoxyl groups; cyano groups; amino groups; $C_1$-$C_{12}$ mono- or di-alkylamine groups; nitro groups. Specific examples of heterocyclic groups are: pyrrolidine, methoxypyrrolidine, piperidine, fluoropiperidine, methylpiperidine, dihydropyridine, piperazine, morpholine, thiazine, indoline, phenylindoline, 2-ketoazetidine, diketopiperazine, tetrahydrofuran, tetrahydrothiophene.

The term "cycle" means a system containing a ring containing from 1 to 12 carbon atoms, optionally containing heteroatoms selected from nitrogen, oxygen, sulfur, silicon, selenium, phosphorous. Specific examples of a cycle are: toluene, benzonitrile, cycloheptatriene, cyclooctadiene, pyridine, piperidine, tetrahydrofuran, thiadiazole, pyrrole, thiophene, selenophene, t-butylpyridine.

The term "trialkyl- or triaryl-silyl groups" means groups comprising one silicon atom to which three $C_1$-$C_{12}$ alkyl groups or three $C_6$-$C_{24}$ aryl groups are bound, or a combination of the two. Specific examples of trialkyl- or triarylsilyl groups are: trimethylsilane, triethylsilane, trihexylsilane, tridodecylsilane, dimethyldodecylsilane, triphenylsilane, methyldiphenylsilane, dimethylnaphthylsilane.

The term "dialkyl- or diaryl-amine groups" means groups comprising a nitrogen atom to which two $C_1$-$C_{12}$ alkyl groups or two $C_6$-$C_{24}$ aryl groups are bound, or a combination thereof. Specific example of dialkyl- or diaryl-amine groups are: dimethylamine, diethylamine, dibutylamine, diisobutylamine, diphenylamine, methylphenylamine, dibenzylamine, ditolylamine, dinaphthylamine.

The term "dialkyl- or diaryl-phosphine groups" means groups comprising one phosphorous atom to which two $C_1$-$C_{12}$ alkyl groups or two $C_6$-$C_{24}$ aryl groups are bound, or a combination thereof. Specific examples of dialkyl- or diaryl-phosphine groups are: dimethylphosphine, diethylphosphine, dibutylphosphine, diphenylphoshine, methylphenylphosine, dinaphthylphosphine.

The term "$C_1$-$C_{20}$ alkoxyl groups" means groups comprising an oxygen atom to which a linear or branched $C_1$-$C_{20}$ alkyl group is bound. Specific examples of $C_1$-$C_{20}$ alkoxyl groups are: methoxyl, ethoxyl, n-propoxyl, iso-propoxyl, n-butoxyl, iso-butoxyl, t-butoxyl, pentoxyl, hexyloxyl, heptyloxyl, octyloxyl, nonyloxyl, decyloxyl, dodecyloxyl.

The term "aryloxyl groups" means groups comprising an oxygen atom to which a $C_6$-$C_{24}$ aryl group is bound. Said aryloxyl groups can be optionally substituted with one or more groups, equal to or different from each other, selected from: halogen atoms such as, for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ trialkylsilyl groups, cyano groups; amino groups; $C_1$-$C_{12}$ mono- or di-alkylamine groups; nitro groups. Specific examples of aryloxyl groups are: phenoxyl, para-methylphenoxyl para-fluorophenoxyl, ortho-butylphenoxyl, naphthyloxyl, anthracenoxyl.

The term "thioalkoxyl or thioaryloxyl groups" means groups comprising a sulfur atom to which a $C_1$-$C_{12}$ alkoxyl group or a $C_6$-$C_{24}$ aryloxyl group is bound. Said thioalkoxyl or thioaryloxyl groups can be optionally substituted with one or more groups, equal to or different from each other, selected from: halogen atoms such as for example, fluorine, chlorine, bromine, preferably fluorine; hydroxyl groups; $C_1$-$C_{12}$ alkyl groups; $C_1$-$C_{12}$ alkoxyl groups; $C_1$-$C_{12}$ thioalkoxyl groups; $C_3$-$C_{24}$ trialkylsilyl groups, cyano groups; amino groups; $C_1$-$C_{12}$ mono- or di-alkylamino groups; nitro groups. Specific examples of thioalkoxyl or thioaryloxyl groups are: thiomethoxyl, thioethoxyl, thiopropoxyl, thiobutoxyl, thioisobutoxyl, 2-ethylthiohexyloxyl, thiophenoxyl, para-methylthiophenoxyl para-fluorothiophenoxyl, ortho-butylthiophenoxyl, naphthylthioxyl, anthracenylthioxyl.

The term "polyethyleneoxyl groups" means groups having from 2 to 80 carbon atoms containing at least one oxyethylene unit. Specific examples of polyethyleneoxyl groups are: methyloxy-ethyleneoxyl, methyloxy-diethyleneoxyl, 3-oxatetraoxyl, 3,6-dioxaheptyloxyl, 3,6,9-trioxadecyloxyl, 3,6,9,12-tetraoxahexadecyloxyl.

According to a preferred embodiment of the present invention, in said general formula (I):

D represents a triarylamine group having general formula (VIII):

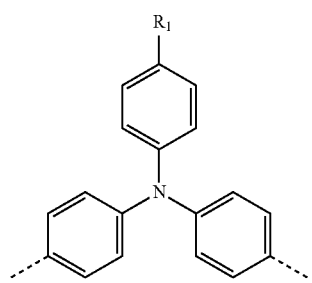

(VIII)

wherein $R_1$ is selected from $C_1$-$C_{20}$ alkoxyl groups, preferably is a methoxyl group;

q is 1;

P represents general formula (Ia) wherein:

T represents a double carbon-carbon bond having general formula (XXVIII) or (XXIX):

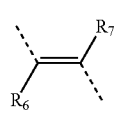

(XXVIII)

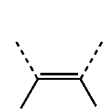

(XXIX)

wherein $R_6$ and $R_7$, the same as each other, represent a hydrogen atom;

n is 1;

$P_1$ represents a bivalent pyrrole group having general formula (XXII):

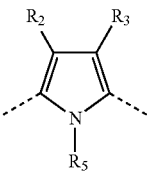

(XXII)

wherein:

$R_5$ is selected from $C_1$-$C_{20}$ alkyl groups, preferably is a methyl group;

$R_2$ and $R_3$, the same as each other, represent a hydrogen atom;

m is 1 and r and s are 0;

A represents a carboxycyanovinylene group having general formula (XLIV):

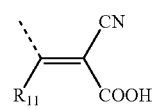

(XLIV)

wherein $R_{11}$ represents a hydrogen atom;

t is 2.

According to a further preferred embodiment of the present invention, in said general formula (I):

D represents a pyrrole group having general formula (XVII):

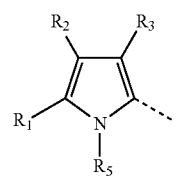

(XVII)

wherein $R_1$, $R_2$ and $R_3$, the same as each other, are a hydrogen atom and $R_5$ is selected from $C_1$-$C_{20}$ alkyl groups, preferably is a methyl group;

q is 0;

A represents a carboxycyanovinylene group having general formula (XLIV):

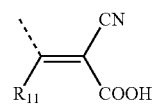

(XLIV)

wherein $R_{11}$ represents a hydrogen atom;

t is 1.

According to a further preferred embodiment of the present invention, in said general formula (I):

D represents a pyrrole group having general formula (XVII):

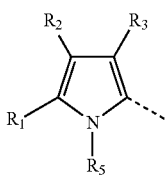

(XVII)

wherein $R_1$, $R_2$ and $R_3$, different from each other, are selected from $C_1$-$C_{20}$ alkyl groups, preferably are a methyl group or an ethyl group, and $R_5$ is selected from $C_1$-$C_{20}$ alkyl groups, preferably is a methyl group;

q is 1;

P represents general formula (Ia) wherein:

T represents a double carbon-carbon bond having general formula (XXVIII) or (XXIX):

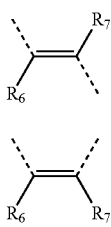

(XXVIII)

(XXIX)

wherein $R_6$ and $R_7$, the same as each other, are a hydrogen atom;

n is 1;

$P_1$ represents a bivalent pyrrole group having general formula (XXII):

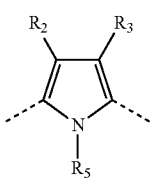

(XXII)

wherein $R_2$ and $R_3$, the same as each other, are a hydrogen atom and $R_5$ is selected from $C_1$-$C_{20}$ alkyl groups, preferably is a methyl group;

m is 1 and r and s are 0;

A represents carboxycyanovinylene group having general formula (XLIV):

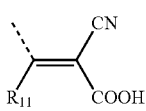

(XLIV)

wherein $R_{11}$ represents a hydrogen atom;

t is 1.

According to a further preferred embodiment of the present invention, in said general formula (I):

D represents a pyrrole group having general formula (XVII):

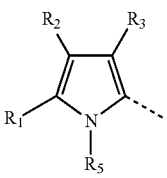

(XVII)

wherein $R_1$, $R_2$ and $R_3$, different from each other, are selected from $C_1$-$C_{20}$ alkyl groups, preferably are a methyl group or an ethyl group, and $R_5$ is a hydrogen atom or it is selected from $C_1$-$C_{20}$ alkyl groups, preferably is a hydrogen atom;

q is 1;

P represents general formula (Ia) wherein:

T represents a double nitrogen-nitrogen bond having general formula (XXX):

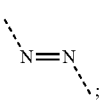

(XXX)

n is 1;

$P_1$ represents a bivalent aryl group having general formula (XXXIX):

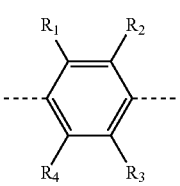

(XXXIX)

wherein $R_1$, $R_2$, $R_3$ and $R_4$, the same as each other, are a hydrogen atom;

m is 1 and r and s are 0;

A represents a group —COOH;

t is 1.

According to a further preferred embodiment of the present invention, in said general formula (I):

D represents a pyrrole group having general formula (XVII):

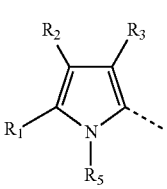

(XVII)

wherein $R_2$ and $R_3$, the same as each other, are a hydrogen atom, $R_1$ is selected from unsaturated $C_1$-$C_{20}$ alkyl groups, optionally containing heteroatoms, preferably is a formyl group, and $R_5$ is selected from $C_1$-$C_{20}$ alkyl groups, preferably is a methyl group;

q is 1;

P represents general formula (Ia) wherein:

T represents a double nitrogen-nitrogen bond having general formula (XXX):

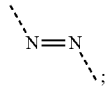

(XXX)

n is 1;

$P_1$ represents a bivalent aryl group having general formula (XXXIX):

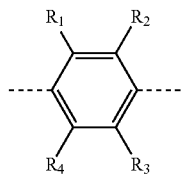

(XXXIX)

wherein $R_1$, $R_2$, $R_3$ and $R_4$, the same as each other, are hydrogen atoms;

m is 1 and r and s are 0;

A represents a —COOH group;

t is 1.

Specific examples of compounds having general formula (I) are reported in Table 1.

TABLE 1

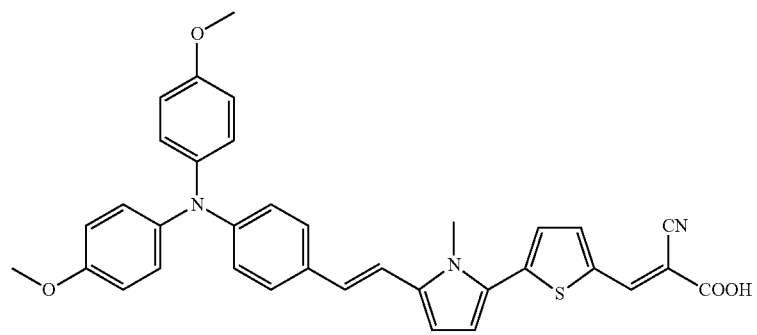 [SMILES: COc1ccc(N(c2ccc(/C=C/c3ccc(-c4ccc(/C=C(\C#N)C(=O)O)s4)n3C)cc2)c2ccc(OC)cc2)cc1]

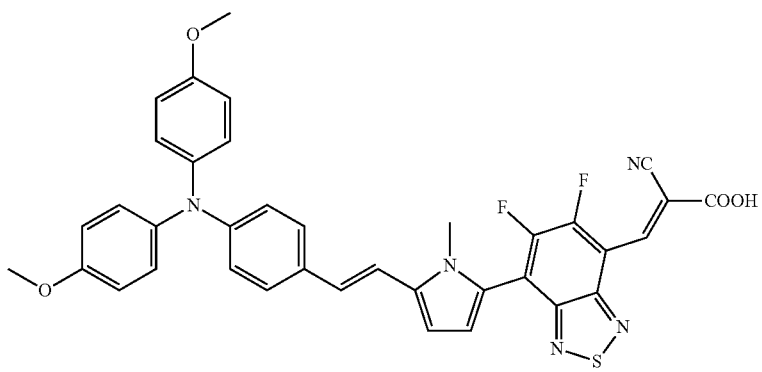 [SMILES: COc1ccc(N(c2ccc(/C=C/c3ccc(-c4c(F)c(F)c(/C=C(\C#N)C(=O)O)c5nsnc45)n3C)cc2)c2ccc(OC)cc2)cc1]

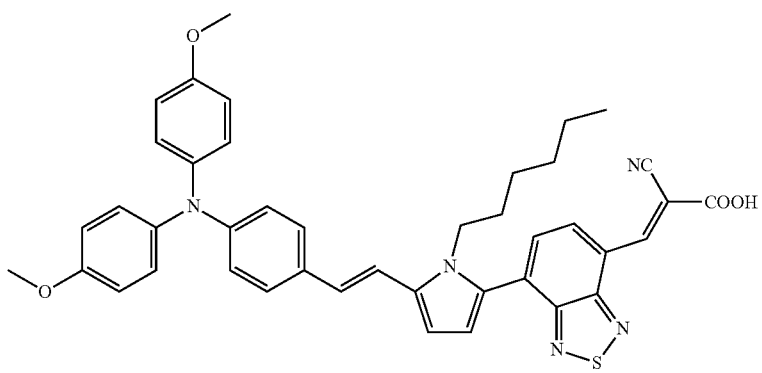 [SMILES: CCCCCCn1c(/C=C/c2ccc(N(c3ccc(OC)cc3)c3ccc(OC)cc3)cc2)ccc1-c1ccc(/C=C(\C#N)C(=O)O)c2nsnc12]

TABLE 1-continued
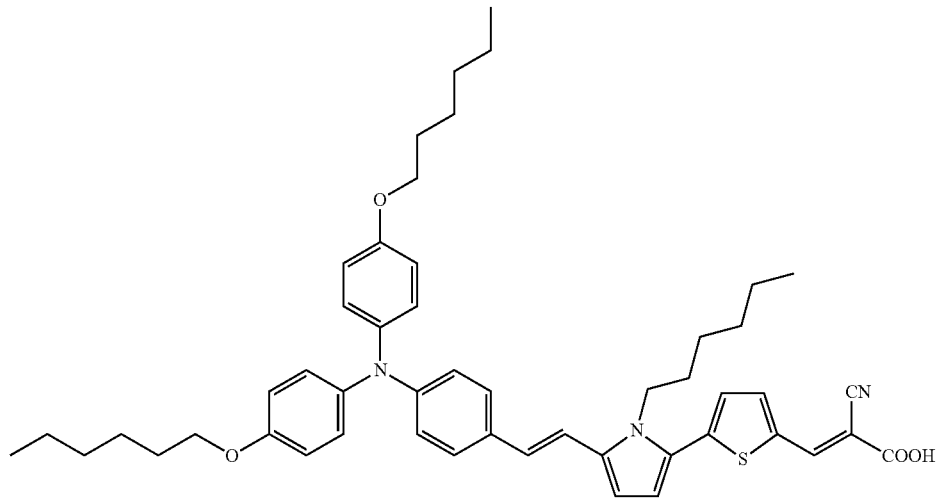 [SMILES: CCCCCCOc1ccc(N(c2ccc(/C=C/c3ccc(-c4ccc(/C=C(\C#N)C(=O)O)s4)n3CCCCCC)cc2)c2ccc(OCCCCCC)cc2)cc1]
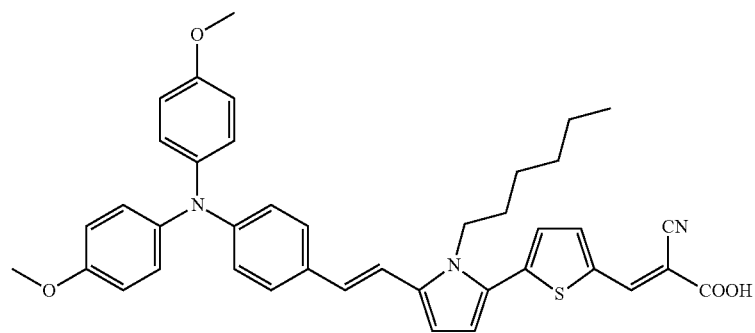 [SMILES: CCCCCCn1c(/C=C/c2ccc(N(c3ccc(OC)cc3)c3ccc(OC)cc3)cc2)ccc1-c1ccc(/C=C(\C#N)C(=O)O)s1]
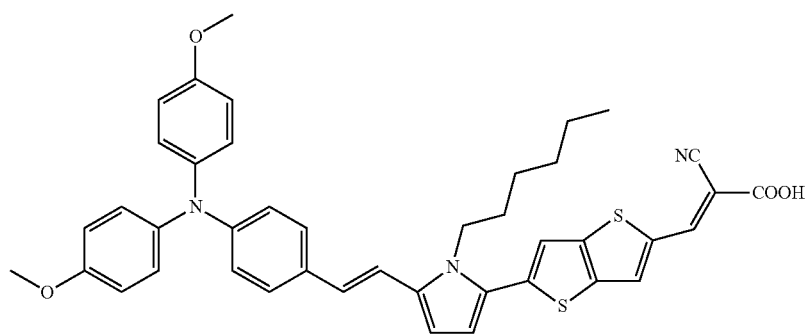 [SMILES: CCCCCCn1c(/C=C/c2ccc(N(c3ccc(OC)cc3)c3ccc(OC)cc3)cc2)ccc1-c1cc2sc(/C=C(\C#N)C(=O)O)cc2s1]
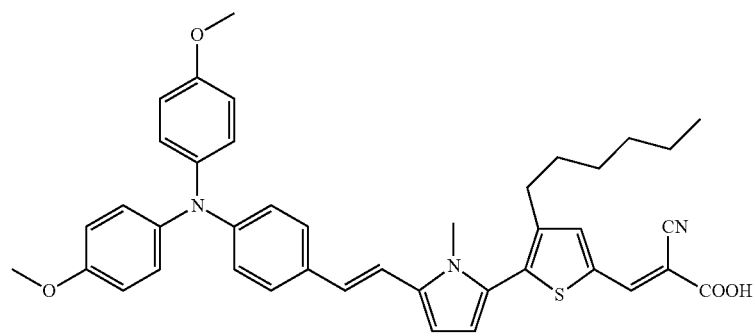 [SMILES: CCCCCCc1cc(/C=C(\C#N)C(=O)O)sc1-c1ccc(/C=C/c2ccc(N(c3ccc(OC)cc3)c3ccc(OC)cc3)cc2)n1C]

TABLE 1-continued
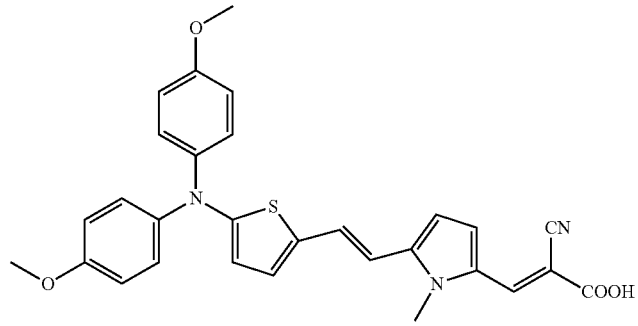 [SMILES: COc1ccc(N(c2ccc(OC)cc2)c2ccc(/C=C/c3ccc(/C=C(\C#N)C(=O)O)n3C)s2)cc1]
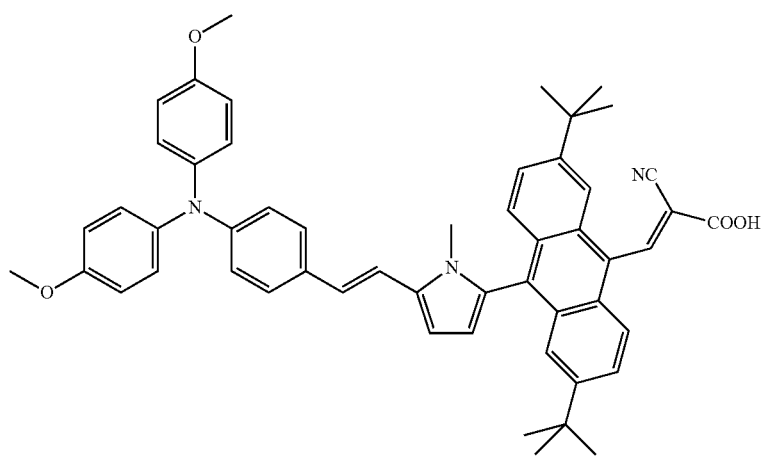 [SMILES: COc1ccc(N(c2ccc(/C=C/c3ccc(-c4c5ccc(C(C)(C)C)cc5c(/C=C(\C#N)C(=O)O)c5ccc(C(C)(C)C)cc45)n3C)cc2)c2ccc(OC)cc2)cc1]
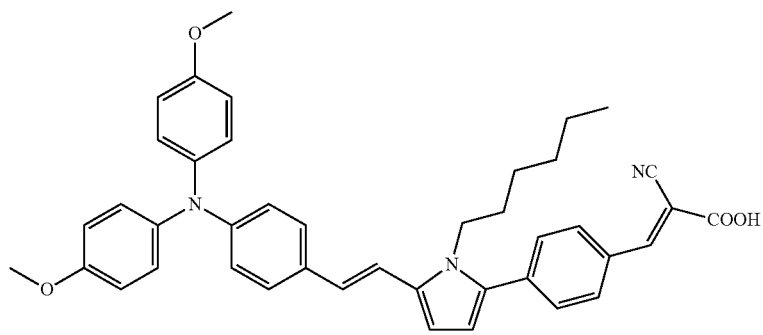 [SMILES: CCCCCCn1c(/C=C/c2ccc(N(c3ccc(OC)cc3)c3ccc(OC)cc3)cc2)ccc1-c1ccc(/C=C(\C#N)C(=O)O)cc1]
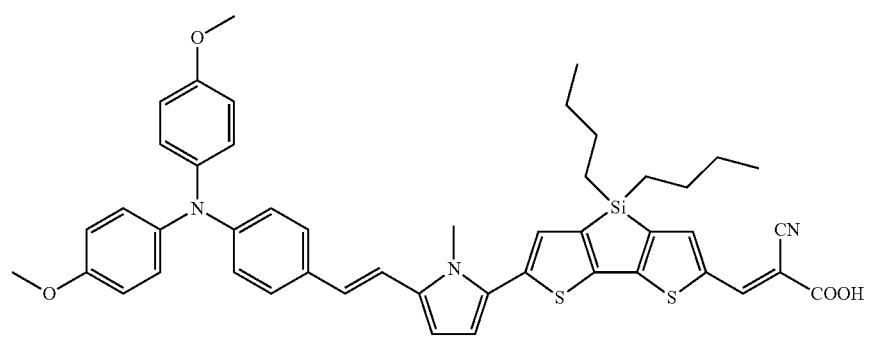 [SMILES: CCCC[Si]1(CCCC)c2cc(/C=C(\C#N)C(=O)O)sc2-c2sc(-c3ccc(/C=C/c4ccc(N(c5ccc(OC)cc5)c5ccc(OC)cc5)cc4)n3C)cc21]

TABLE 1-continued
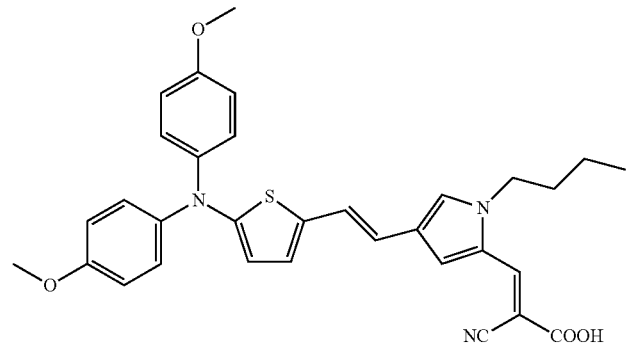 [SMILES: CCCCn1cc(/C=C/c2ccc(N(c3ccc(OC)cc3)c3ccc(OC)cc3)s2)cc1/C=C(\C#N)C(=O)O]
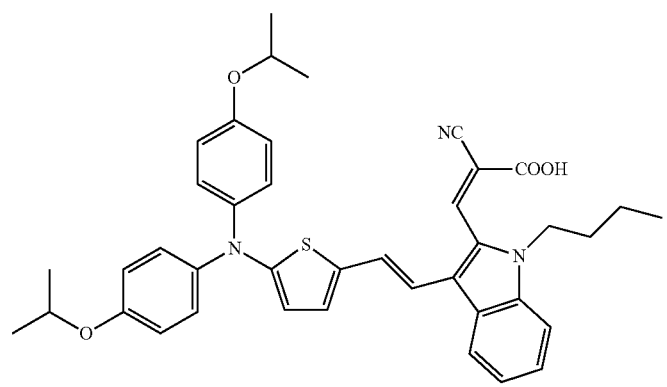 [SMILES: CCCCn1c(/C=C(/C#N)C(=O)O)c(/C=C/c2ccc(N(c3ccc(OC(C)C)cc3)c3ccc(OC(C)C)cc3)s2)c2ccccc21]
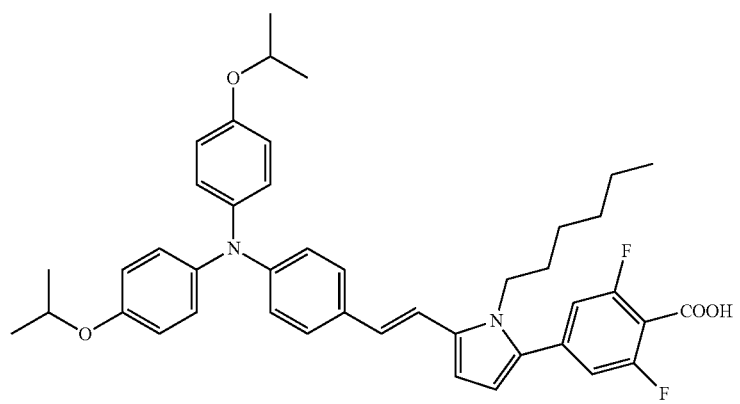 [SMILES: CCCCCCn1c(/C=C/c2ccc(N(c3ccc(OC(C)C)cc3)c3ccc(OC(C)C)cc3)cc2)ccc1-c1cc(F)c(C(=O)O)c(F)c1]

TABLE 1-continued
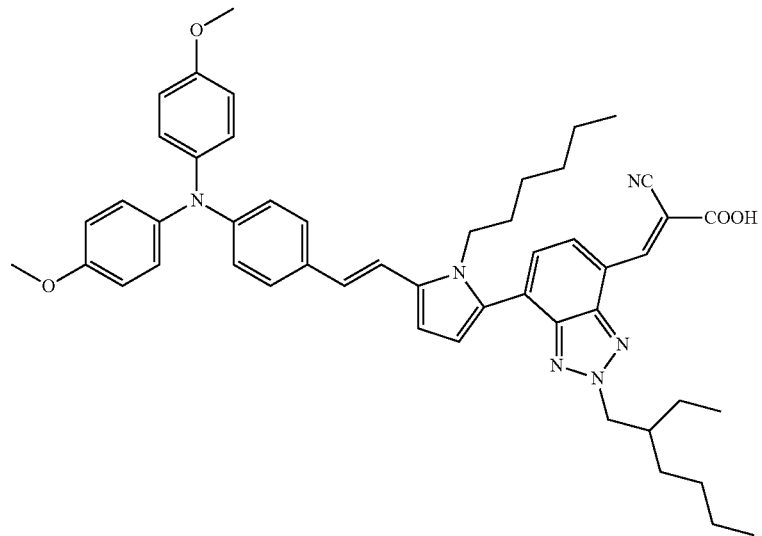 [SMILES: CCCCCCn1c(/C=C/c2ccc(N(c3ccc(OC)cc3)c3ccc(OC)cc3)cc2)ccc1-c1ccc(/C=C(\C#N)C(=O)O)c2nn(CC(CC)CCCC)nc12]
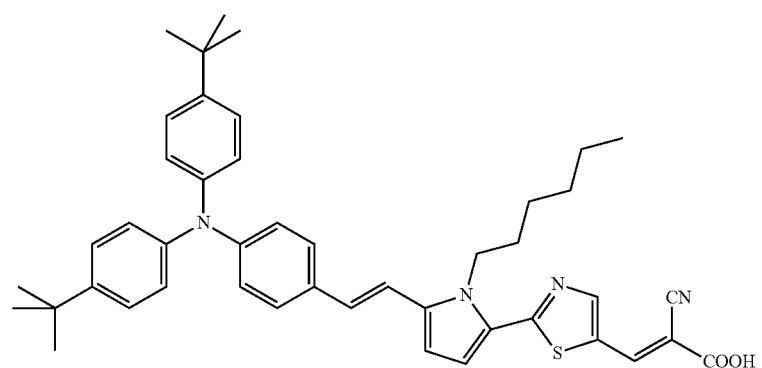 [SMILES: CCCCCCn1c(/C=C/c2ccc(N(c3ccc(C(C)(C)C)cc3)c3ccc(C(C)(C)C)cc3)cc2)ccc1-c1ncc(/C=C(\C#N)C(=O)O)s1]
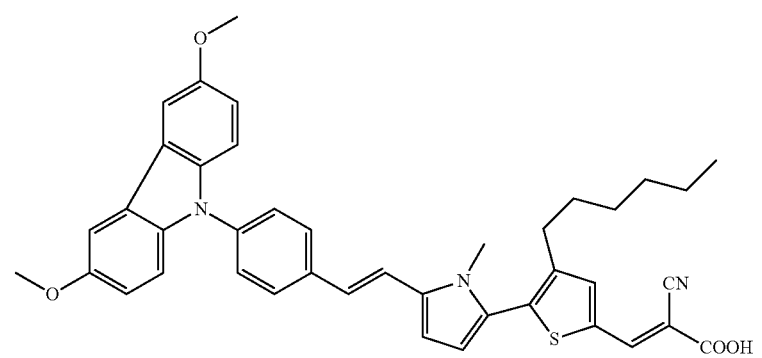 [SMILES: CCCCCCc1cc(/C=C(\C#N)C(=O)O)sc1-c1ccc(/C=C/c2ccc(-n3c4ccc(OC)cc4c4cc(OC)ccc43)cc2)n1C]

TABLE 1-continued
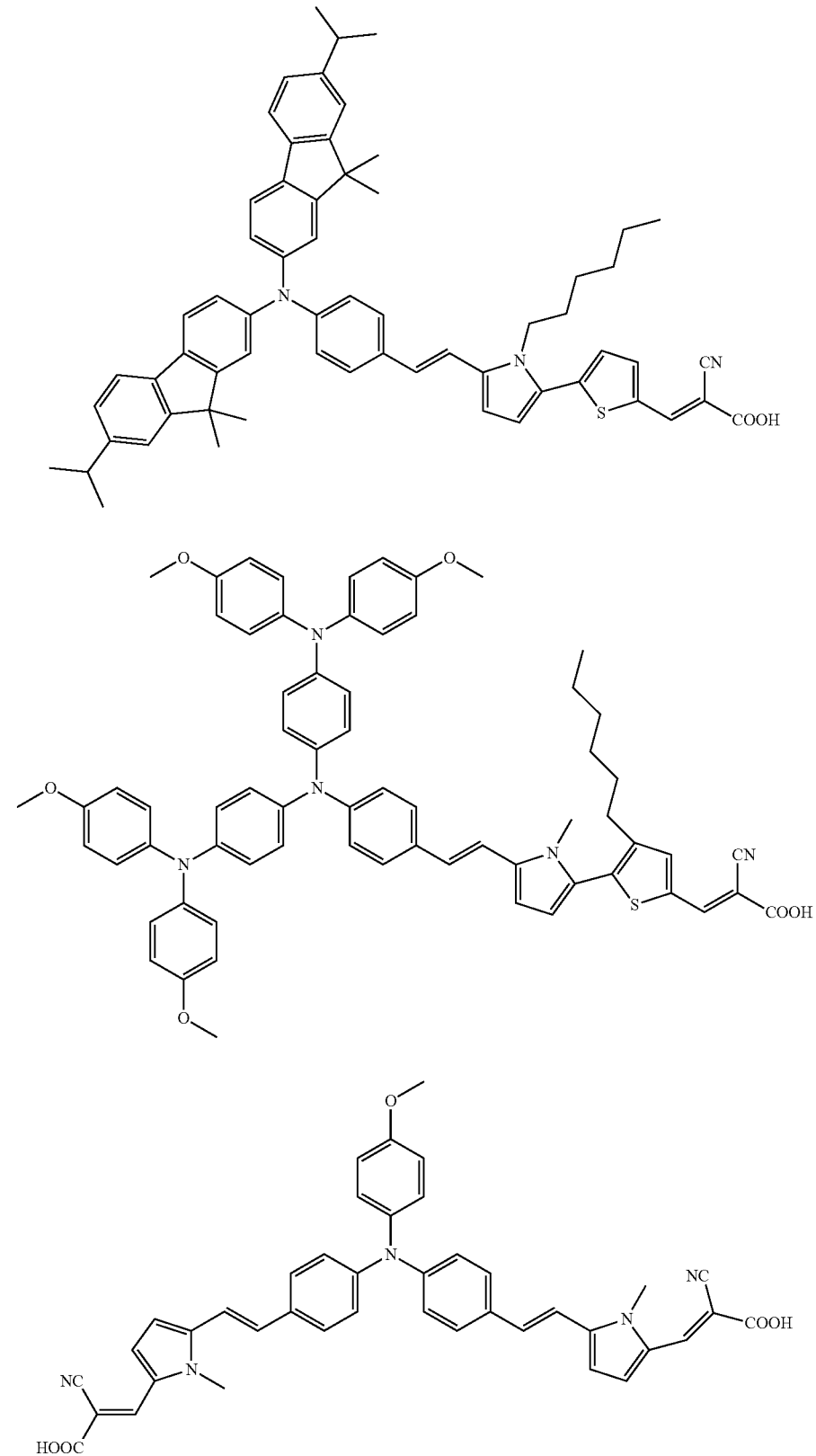

TABLE 1-continued
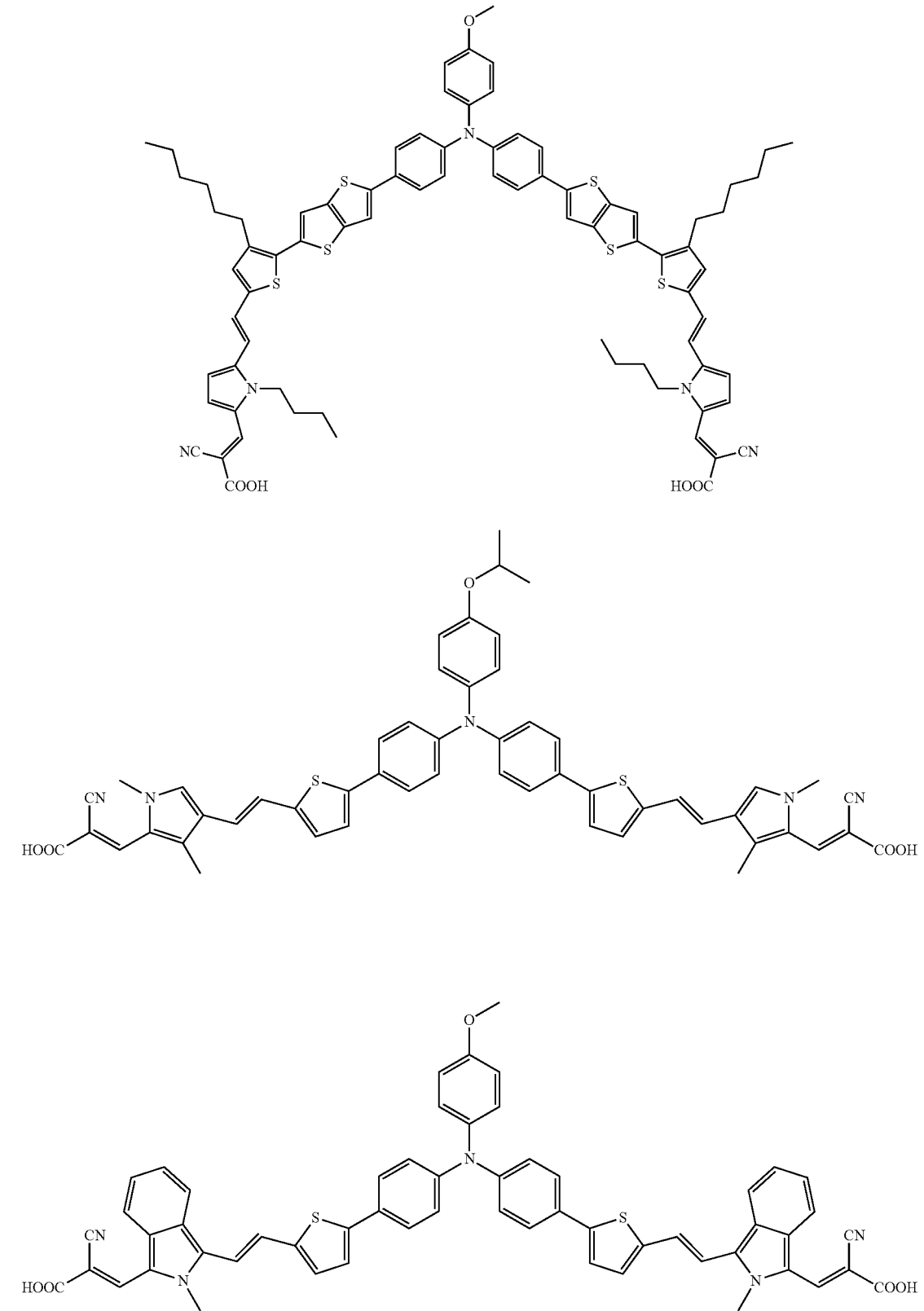

TABLE 1-continued
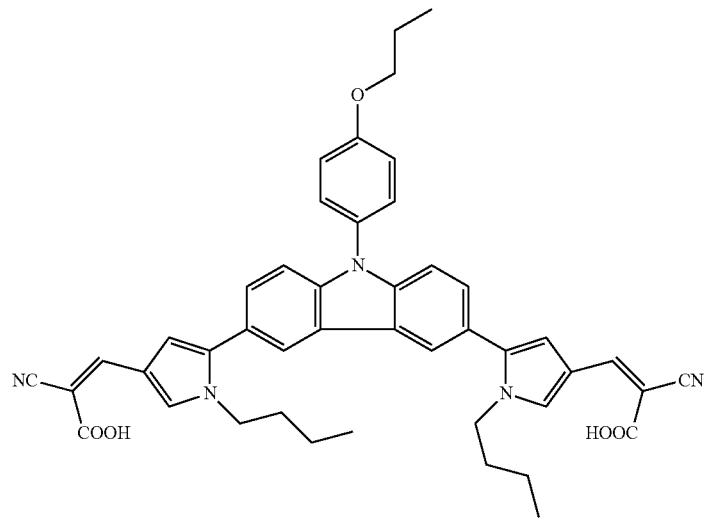 [SMILES: CCCCn1cc(/C=C(/C#N)C(=O)O)cc1-c1ccc2c(c1)c1cc(-c3cc(/C=C(/C#N)C(=O)O)cn3CCCC)ccc1n2-c1ccc(OCCC)cc1]
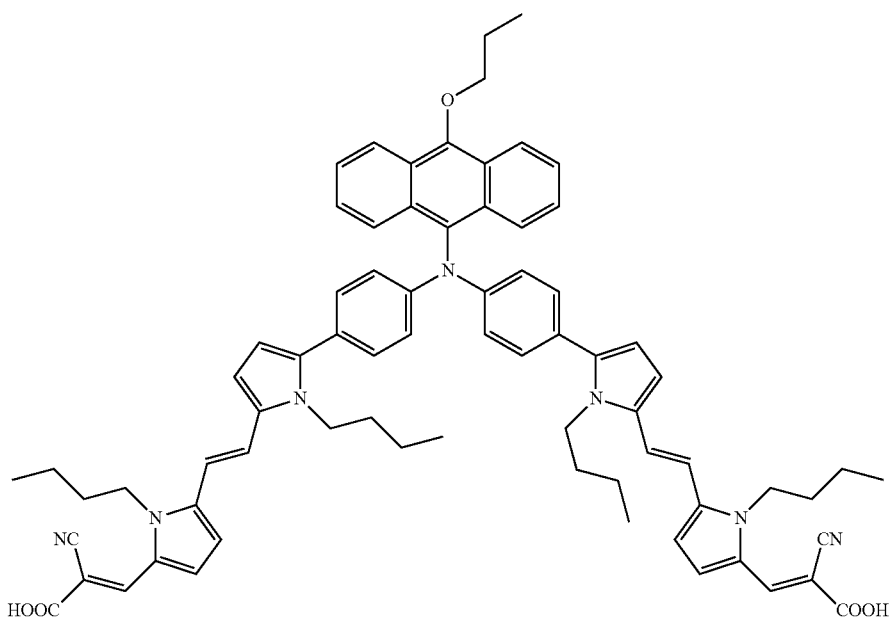 [SMILES: CCCCn1c(/C=C/c2ccc(-c3ccc(N(c4ccc(-c5ccc(/C=C/c6ccc(/C=C(\C#N)C(=O)O)n6CCCC)n5CCCC)cc4)c4c5ccccc5c(OCCC)c5ccccc45)cc3)n2CCCC)ccc1/C=C(\C#N)C(=O)O]
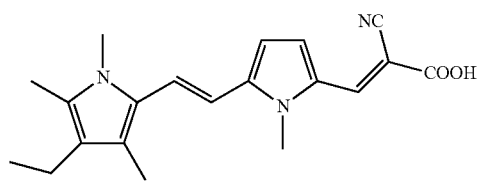 [SMILES: CCc1c(C)c(/C=C/c2ccc(/C=C(\C#N)C(=O)O)n2C)n(C)c1C]
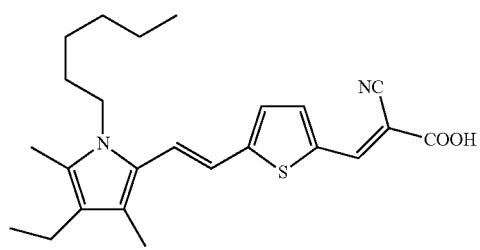 [SMILES: CCCCCCn1c(C)c(CC)c(C)c1/C=C/c1ccc(/C=C(\C#N)C(=O)O)s1]

TABLE 1-continued
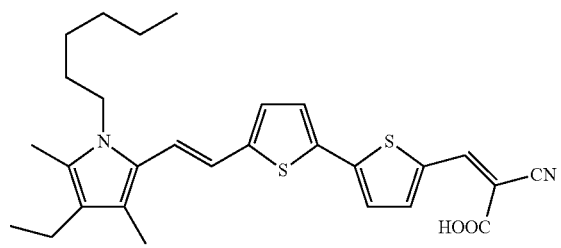 [SMILES: CCCCCCn1c(C)c(CC)c(C)c1/C=C/c1ccc(-c2ccc(/C=C(/C#N)C(=O)O)s2)s1]
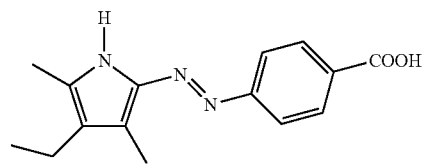 [SMILES: CCc1c(C)[nH]c(/N=N/c2ccc(C(=O)O)cc2)c1C]
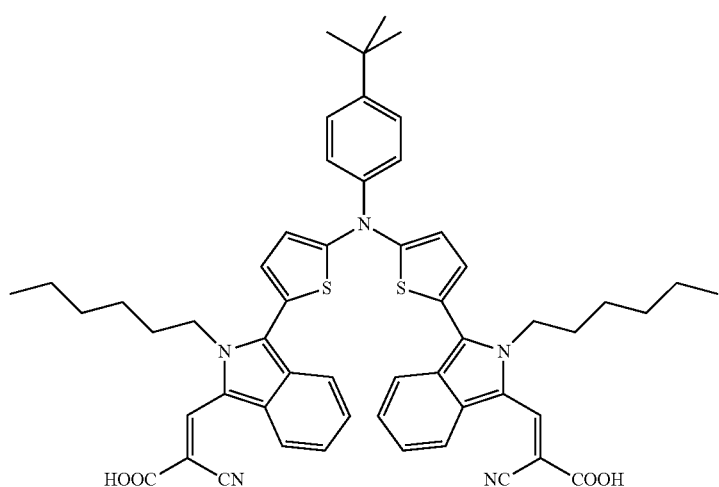 [SMILES: CCCCCCn1c(/C=C(\C#N)C(=O)O)c2ccccc2c1-c1ccc(N(c2ccc(C(C)(C)C)cc2)c2ccc(-c3c4ccccc4c(/C=C(\C#N)C(=O)O)n3CCCCCC)s2)s1]
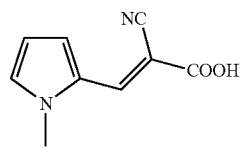
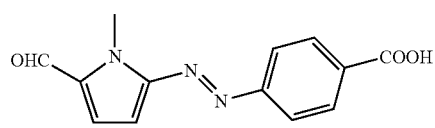 [SMILES: Cn1c(C=O)ccc1/N=N/c1ccc(C(=O)O)cc1]
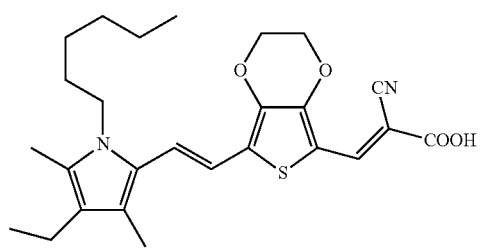 [SMILES: CCCCCCn1c(C)c(CC)c(C)c1/C=C/c1sc(/C=C(\C#N)C(=O)O)c2c1OCCO2]

TABLE 1-continued
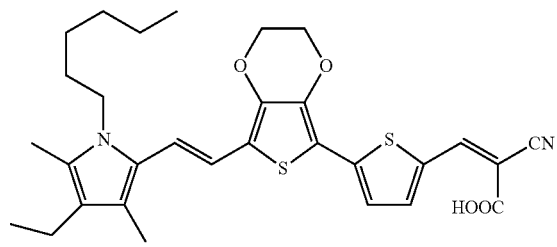 [SMILES: CCCCCCn1c(C)c(CC)c(C)c1/C=C/c1sc(-c2ccc(/C=C(/C#N)C(=O)O)s2)c2c1OCCO2]
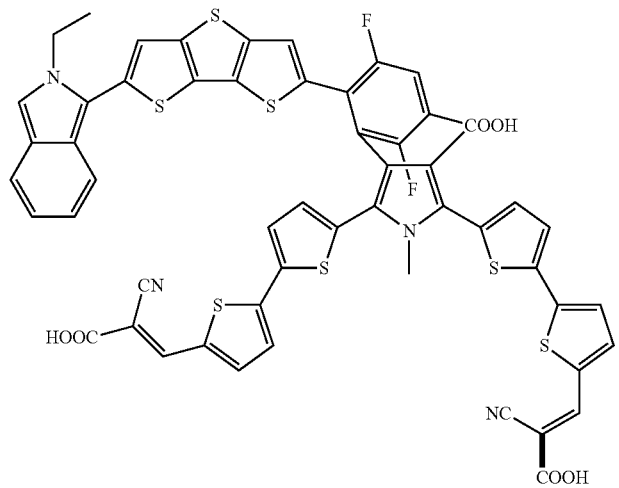
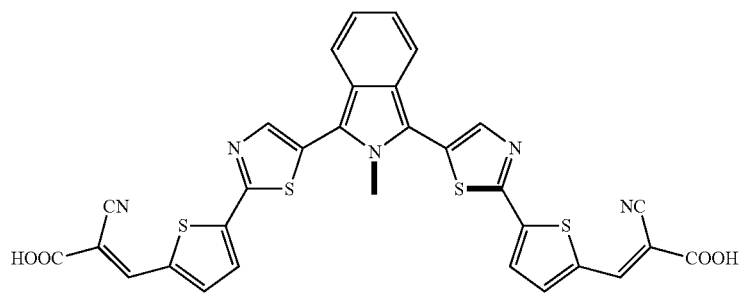
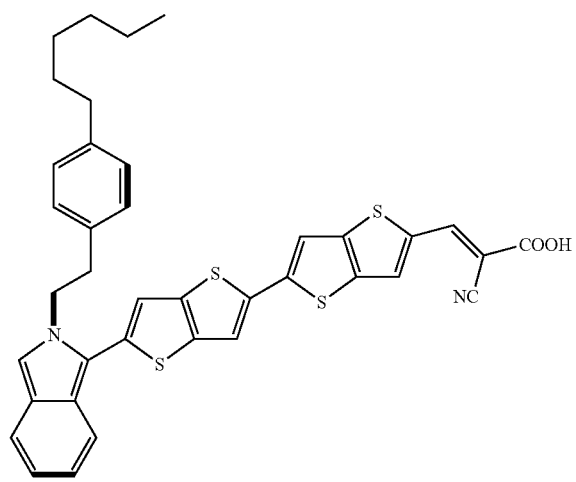

TABLE 1-continued

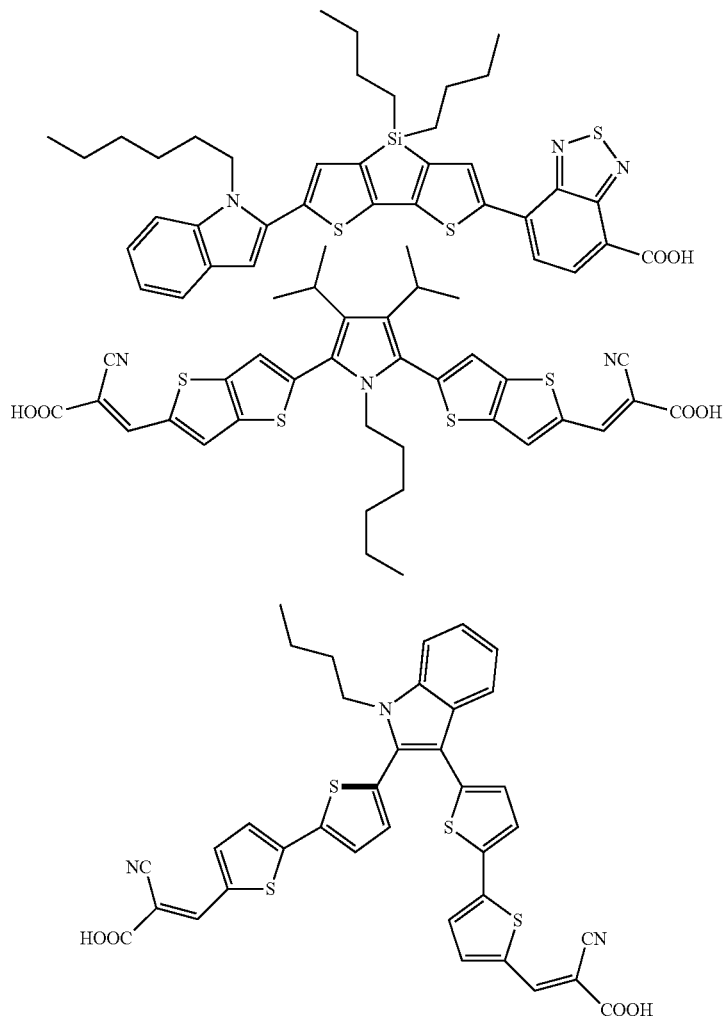

The organic dye having general formula (I), object of the present invention, can be obtained by means of several processes known in the art, such as, for example:
- reactions for the formation of double bonds, as described, for example, by Abbotto A. et al., in "*Energy & Environmental Science*" (2009), Vol. 2, pages 1094-1101;
- reactions for the formation of the triple bond (for example, the "cross-coupling" reaction of Sonogashira);
- reactions for the formation of the aryl-aryl bond (for example, "cross-coupling" reactions catalyzed by a metal, among which the Suzuki reaction or Stille reaction).

Further details relating to the preparation of the above organic dye having general formula (I) are provided in the following examples.

According to a further aspect, the present invention relates to a dye sensitized photoelectric transformation element, comprising at least one organic dye having general formula (I), said dye sensitized photoelectric transformation element being supported on particles of a semiconductor oxide.

The photoelectric transformation element according to the present invention can be prepared by means of a process for the preparation of a dye sensitized photoelectric transformation element for dye sensitized solar cells" (DSSCs) according to the known art, except for the use of the organic dye having general formula (I).

The photoelectric transformation element according to the present invention, is preferably prepared by forming a thin film of a semiconductor oxide on a substrate and subsequently supporting at least one organic dye having general formula (I) on said thin film.

The substrate on which the thin film of semiconductor oxide is formed, preferably has a conductive surface, and is available on the market. Said substrate may preferably be selected, for example, from: glass; transparent polymers such as, for example, polyethyleneterephthalate (PET), poly (ethylene-naphthalate) (PEN), polyethersulfone; or mixtures thereof. Said substrate may preferably have a conductivity lower than or equal to 1,000Ω, more preferably lower than 100Ω.

A metal oxide is preferred as semiconductor oxide in the form of particles. Said semiconductor oxide can preferably be selected, for example, from: titanium dioxide, tin oxide, zinc oxide, tungsten oxide, zirconium oxide, gallium oxide, indium oxide, yttrium oxide, niobium oxide, tantalum oxide, vanadium oxide, or mixtures thereof. Titanium dioxide, tin oxide, zinc oxide, niobium oxide, indium oxide, or mixtures thereof are more preferably used; titanium dioxide, zinc oxide or tin oxide, or mixtures thereof, are more preferred; titanium dioxide is even more preferred.

Preferably, the particles of semiconductor oxide may have an average diameter ranging from 1 nm to 500 nm, more preferably ranging from 1 nm to 100 nm, and those having a large diameter and a small diameter can be mixed, or used in multilayers.

The thin film of semiconductor oxide can be prepared using various known techniques, such as, for example: by spraying particles of semiconductor oxide to form a thin film directly on a substrate; by means of electric deposition of a thin film of particles of semiconductor oxide using a substrate as electrode; by the application of a dispersion or paste of particles of semiconductor oxide, containing particles obtained by the hydrolysis of suitable precursors such as a metal halide or alkoxide, on a substrate (doctor blade technique) and subsequent drying, hardening or sintering. The paste is preferably applied on a substrate: in this case, the dispersion can be obtained by dispersing the particles of semiconductor oxide, with an average particle diameter ranging from 1 nm to 200 nm, in a dispersing medium, using a method known in the art.

Any dispersing medium can be used, provided it is capable of dispersing the particles of semiconductor oxide. Said dispersing medium may preferably be selected, for example, from: water; alcohols such as, for example, ethanol; ketones, such as, for example, acetone, acetylacetone; hydrocarbons such as, for example, hexane; or mixtures thereof. Water is preferred as it minimizes the variation in the viscosity of the dispersion. A dispersion stabilizer can be optionally used in order to stabilize the dispersion of the particles of semiconductor oxide. Said dispersion stabilizer may preferably be selected, for example, from acids, such as, for example, acetic acid, hydrochloric acid, nitric acid, acrylic acid; ketones such as, for example, acetyl acetone; glycols such as, for example, diethyleneglycol, polyethyleneglycol; alcohols such as, for example, ethyl alcohol, polyvinyl alcohol; or mixtures thereof.

The substrate on which the dispersion is applied can be subjected to sintering and the sintering temperature can be higher than or equal to 100° C., preferably higher than or equal to 200° C. In any case, the upper limit of the sintering temperature can be the melting point or the softening point of the substrate, normally 900° C., preferably 600° C. The sintering time is not necessarily specifically limited, but preferably does not exceed 24 hours.

The thickness of the thin film on the substrate can range from 0.5 μm to 200 μm, preferably from 1 μm to 50 μm. The thin film of semiconductor oxide can be subjected to a secondary treatment. For example, the thin film can be immersed in a solution of alkoxide, chloride, nitride or sulfide, of the metal identical to the semiconductor oxide, and dried or re-sintered, thus improving the properties of the thin film. The metal alkoxide can be selected, for example, from: titanium ethoxide, titanium iso-propoxide, titanium t-butoxide, tin n-dibutyl-diethossyl, or mixtures thereof. There are no particular limitations in the choice of solvent in which said metal alkoxide is dissolved, an alcohol solution of said metal alkoxide is preferably used. The metal chloride can be selected, for example, from: titanium tetrachloride, tin tetrachloride, zinc chloride, or mixtures thereof. There are no particular limitations in the choice of solvent in which said metal chloride is dissolved, an aqueous solution of said metal chloride is preferably used. The thin film of semiconductor oxide thus obtained can be composed of particles of semiconductor oxide.

The method for supporting the organic dye on the particles of semiconductor oxide in the form of thin film is not limited to a specific method. A substrate having the thin film of semiconductor oxide formed on the same can be immersed, for example, in a solution obtained by dissolution of the organic dye having general formula (I) in a solvent capable of dissolving the same, or in a dispersion obtained by dispersing said organic dye having general formula (I). The concentration of the solution or of the dispersion can be suitably determined. The immersion temperature can range from −60° C. to 100° C., preferably ranging from 0° C. to 50° C., and is more preferably room temperature (25° C.), and the immersion time can range from about 1 minute to 7 days, preferably ranging from 1 hour to 26 hours. The solvent used for dissolving the organic dye can be selected, for example, from: methanol, ethanol, acetonitrile, methoxypropionitrile, chloroform, dichloromethane, dimethylsulfoxide, dimethylformamide, acetone, tetrahydrofuran, toluene, t-butanol, or mixtures thereof. The concentration of the solution can normally range from $1 \times 10^{-6}$ M to 1 M, preferably ranging from $1 \times 10^{-5}$ M to $1 \times 10^{-1}$ M. In this way, a dye sensitized photoelectric transformation element can be obtained, comprising particles of semiconductor oxide on a dye sensitized thin film.

The organic dye having general formula (I) can be optionally mixed with other organic dyes or dyes based on metal complexes. Dyes based on metal complexes which can be mixed, can include, but are not specifically limited to, ruthenium dipyridine complexes, in both neutral and ionic form, phthalocyanines and porphyrins of various metals such as, for example, zinc, copper, cobalt, nickel, iron, ruthenium, platinum, manganese; other metal-free organic dyes which can be mixed can include phthalocyanines, porphyrins, cyanines, merocyanines, oxonols, triphenylmethane dyes, methine dyes such as the acrylated dyes described in european patent application EP 1,311,001, xanthenes, azo, anthraquinones, perylene dyes (as described by Nazeeruddin M. K., in "*Journal of the American Chemical Society*" (1993), Vol. 115, pages 6382-6390).

If two or more types of organic dyes are used in combination, they can be absorbed in sequence on a thin layer of semiconductor oxide, or mixed, dissolved and absorbed.

In order to prevent the aggregation of the organic dye on the thin layer of semiconductor oxide, the organic dye having general formula (I) can be optionally mixed with an inclusion compound (co-adsorbent): the mixture obtained can be adsorbed on a thin layer of semiconductor oxide using methods known in the art. The inclusion compound can be selected, for example, from: cholic acids such as deoxycholic acid, dehydrodeoxycholic acid, chenodeoxycholic acid, methyl ester of cholic acid, sodium salt of cholic acid; polyethylene oxides; crown ethers; cyclodextrins; calixarenes, polyethyleneoxides; or mixtures thereof.

After supporting the organic dye, the surface of a semiconductor electrode can be treated with a compound which can be selected from: amine compounds such as, for example, 4-t-butylpyridine; alcohols such as, for example, methanol, ethanol, butanol, or mixtures thereof; organic acids such as, for example, acetic acid, propionic acid, or mixtures thereof; or mixtures thereof. For example, a substrate on which a thin film of particles of semiconductor oxide has been formed combined with a dye can be immersed in a solution of an amine in ethanol.

According to a further aspect, the present invention also relates to a dye sensitized solar cell (DSSC) comprising the dye sensitized photoelectric transformation element described above.

Said dye sensitized solar cell (DSSC) can be prepared by means of methods known in the art for the preparation of solar cells, using a photoelectric transformation element of the known art, except for the use of a dye sensitized photoelectric transformation element, comprising particles of semiconductor oxide in which the organic dye having general formula (I) is supported. The dye sensitized solar cell (DSSC) can comprise a photoelectric transformation element as electrode (negative electrode) in which the organic dye having general formula (I) is supported on particles of semiconductor oxide, a counter-electrode (positive electrode), a redox electrolyte, a hole-transporting material, or a semiconductor compound of the p type.

The dye sensitized solar cell (DSSC) according to the present invention may preferably be prepared by the deposition of a titanium dioxide paste on a transparent conductive substrate; sintering of the coated substrate to form a thin film of titanium dioxide; immersion of the substrate on which the substrate of thin film of titanium dioxide is formed in a solution in which the organic dye having general formula (I) is dissolved, so as to form an electrode with a film of titanium dioxide with absorbed dye; production of a second transparent conductive substrate on which a counter-electrode is formed; formation of a hole which penetrates through the second transparent conductive substrate and the counter-electrode; laying of a film of thermoplastic polymer between the counter-electrode and the electrode with the film of titanium dioxide with absorbed dye and hot pressure in order to bind the counter-electrode and the electrode with the film of titanium dioxide; injection of the electrolyte into the film of thermoplastic polymer positioned between the counter-electrode and the electrode with the film of titanium dioxide through the hole; and closing of the hole with suitable materials which can be selected, for example, from thermoplastic polymers.

The redox electrolyte, the hole-transporting material, or the semiconductive compound of the p type, can be in liquid form (for example, ionic liquids), or in a coagulated form (gel and gel phase), or also solid. The liquid can be selected, for example, from those obtained by dissolving the redox electrolyte, a dissolved salt, the hole-transporting material, or the semiconductive compound of the p type in a solvent, and a salt dissolved at room temperature. The coagulated form (gel and gel phase) can be selected, for example, from those obtained by inclusion of the redox electrolyte, a dissolved salt, the hole-transporting material, or the semiconductive compound of the p type in a polymer matrix or in a low-molecular-weight gelling agent. The solid can be selected, for example, from the redox electrolyte, a dissolved salt, the hole-transporting material, or the semiconductive compound of the p type.

The hole-transporting material can be selected, for example, from: amine derivatives; conductive polymers such as, for example, polyacetylene, polyaniline, polythiophene; or discotic liquid crystalline phases such as, for example, triphenylene. The semi-conductive compound of the p type can be selected, for example, from copper iodide (CuI), copper thiocyanate (CuSCN). As counter-electrode, those having a conductivity and catalytic function on the reduction of the redox electrolyte may preferably be used and, for example, those obtained by the deposition of platinum, carbon, rhodium, ruthenium, on a glass or polymeric film, or by applying conductive particles on the same may be used.

The redox electrolyte used in the dye sensitized solar cell (DSSC) according to the present invention, can include a redox electrolyte based on halogen comprising halogenated compounds comprising a halogen ion as counter-ion and a halogen molecule; metal redox electrodes as ferrocyanide-ferricyanide or ferrocene-ferricinium ion; metal complexes such as cobalt complexes; redox organic electrolytes such as, for example, alkylthio-alkyldisulfide, viologen dye, hydroquinone-quinone. Redox electrolytes based on halogen are preferred. As halogen molecule included in the halogenated redox electrolyte, an iodine molecule is preferred. As halogenated compounds comprising a halogen ion as counter-ion, a halogenated inorganic salt can be used such as, for example, lithium iodide (LiI), sodium iodide (NaI), potassium iodide (KI) caesium iodide (CsI), ammonium iodide [$(NH_4)I$], calcium diiodide ($CaI_2$), magnesium diiodide ($MgI_2$), barium diiodide ($BaI_2$), copper iodide (CuI), copper diiodide ($CuI_2$), zinc diiodide ($ZnI_2$), or an organic ammonium halide such as, for example, tetra alkyl-ammonium iodide, imidazolium iodide, pyridinium iodide or iodine ($I_2$).

If the redox electrolyte is in the form of a solution, an electrochemically inert solvent can be used. The following can be used, for example: acetonitrile, propylenecarbonate, ethylenecarbonate, 3-methoxy-propionitrile, methoxy-acetonitrile, valeronitrile, ethyleneglycol, propyleneglycol, diethyleneglycol, triethyleneglycol, butyrolactone, dimethoxyethane, dimethylcarbonate, 1,3-dioxolane, methylformiate, 2-methyltetrahydrofuran, 3-methoxy-oxazolidin-2-one, sulfolane, tetrahydrofuran, water. Acetonitrile, valeronitrile, propylenecarbonate, ethylenecarbonate, 3-methoxypropionitrile, ethyleneglycol, 3-methoxy-oxazolidin-2-one, butyrolactone, are preferred. Said solvents can be used alone or mixed with each other.

As positive electrolyte in gel phase, those obtained by including the electrolyte or the electrolyte solution in an oligomeric or polymeric matrix, or including the electrolyte or the electrolyte solution in a starch-based gelling agent, can be used.

The concentration of the redox electrolyte can preferably range from 0.01% by weight to 99% by weight, more preferably ranging from 0.1% by weight to 30% by weight with respect to the total weight of the solution.

The dye sensitized solar cell (DSSC) according to the present invention can be obtained by preparing a photoelectric transformation element (negative electrode—anode) in which the organic dye having general formula (I) is supported on particles of semiconductive oxide on a substrate, and a counter-electrode (positive electrode) opposite the same, and inserting a solution containing the redox electrolyte between them.

The present invention will be further illustrated hereunder by the following examples which are provided for purely illustrative and non-limiting purposes of the same invention.

EXAMPLES

Reagents and Materials

The reagents and materials used in the following examples of the invention, their optional pretreatments and producer are reported in the following list:

tetrahydrofuran (THF) of Aldrich: anhydrified by distillation on lithium aluminium hydride ($LiAlH_4$) in an inert atmosphere;

potassium t-butoxide (t-BuOK) of Aldrich: used as such;

dimethylformamide (DMF) of Aldrich: used as such;
phosphorous oxychloride (POCl$_3$) of Aldrich: used as such;
1,2-dichloroethane of Acros: used as such;
2-cyanoacetic acid of Aldrich: used as such;
piperidine of Aldrich: used as such;
chloroform (CHCl$_3$) of Carlo Erba: used as such;
dichloromethane (CH$_2$Cl$_2$) of Carlo Erba: used as such;
ethyl acetate (AcOEt) of Carlo Erba: used as such;
sodium sulfate (Na$_2$SO$_4$) of Carlo Erba: used as such;
potassium carbonate (K$_2$CO$_3$) of Aldrich: used as such;
tetramethylsilane (Me$_4$Si) of Carlo Erba: used as such;
deuterated dimethylsulfoxide (DMSO-d$_6$) of Carlo Erba: used as such;
deuterated chloroform (CDCl$_3$) of Acros: used as such;
N-methylpyrrole-2-carboxyaldehyde of Aldrich: used as such;
3-ethyl-2,4-dimethylpyrrole of Aldrich: used as such;
pyridine of Carlo Erba: used as such;
ethanol (EtOH) of Carlo Erba: used as such;
sodium nitrite (NaNO$_2$) of Aldrich: used as such;
4-aminobenzoic acid of Aldrich: used as such;
hydrochloric acid at 37% (HCl) of Carlo Erba: used as such or in aqueous solution at 10%;
petroleum ether (40° C.-70° C.) of Carlo Erba: used as such.

The following characterization methods were used in the following examples.

Reactions and Products Obtained

The reactions were checked by means of thin layer chromatography, on Polygram Sil G/UV254 silica gel having a thickness of 0.20 mm, revealing the blotches separated by irradiation of the supports with UV light (254 nm and 365 nm).

The compounds obtained were purified by means of flash chromatography using Merck 9385 silica gel having a particle size ranging from 230 mesh to 400 mesh (40 mm-63 mm) and a pore size equal to 60 Å. Said flash chromatography was carried out as described by Still, W. C. et al. in "*Journal of Organic Chemistry*" (1978), Vol. 43, pages 2923-2925.

NMR Spectra

The NMR spectra of the compounds obtained were obtained using a NMR Bruker ANX-500 spectrometer.

For this purpose, about 10 mg of the sample to be examined were dissolved in about 0.8 ml of a suitable deuterated solvent directly inside the glass tube used for the measurement. The scale of chemical shifts was calibrated with reference to the tetramethylsilane signal set at 0 ppm.

Example 1

Preparation of the Compound F1

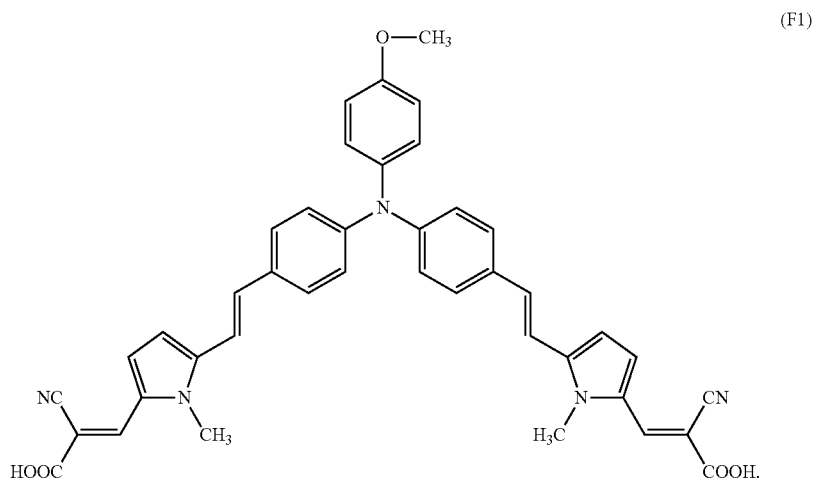 [SMILES: COc1ccc(N(c2ccc(/C=C/c3ccc(/C=C(\C#N)C(=O)O)n3C)cc2)c2ccc(/C=C/c3ccc(/C=C(\C#N)C(=O)O)n3C)cc2)cc1]

The compound F1 was obtained according to the following Scheme 1:

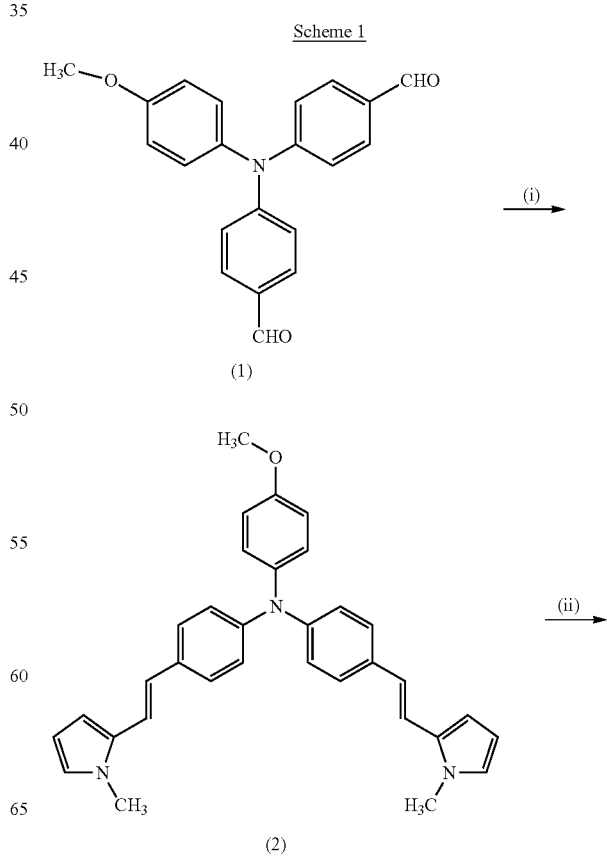

-continued

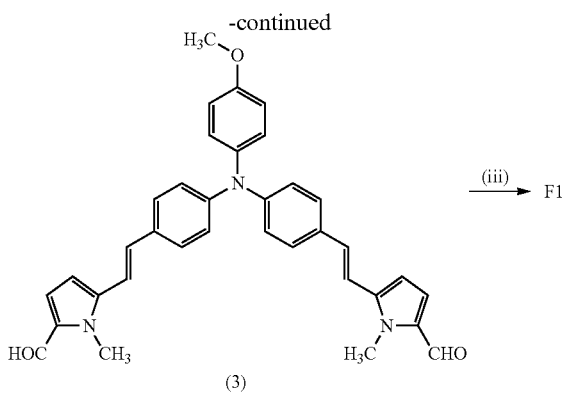

wherein: (i) indicates [(1-methyl-1-H-pyrrol-2-yl)methyl] triphenylphosphonium iodide, potassium t-butoxide (t-BuOK), anhydrous tetrahydrofuran (THF); (ii) indicates dimethylformamide (DMF), phosphorous oxychloride (POCl₃), 1,2-dichloroethane; (iii) indicates 2-cyanoacetic acid, piperidine, chloroform (CHCl₃).

Synthesis of N,N-bis-{4-[N-methylpyrrol-2-yl)vin-2-yl]phenyl}-p-methoxyaniline (2)

0.497 g (1.5 mmoles) of N,N-bis-(4-formylphenyl)-p-methoxyaniline (1) [obtained as described by El-Khouly M. E. et al., in "*The Journal of Physical Chemistry B*" (2008), Vol. 112, pages 3910-3917], 1.55 g (3.2 mmoles) of [(1-methyl-1-H-pyrrol-2-yl)methyl]triphenylphosphonium iodide [obtained as described by Rawal V. H. et al., in "*The Journal of Organic Chemistry*" (1987), Vol. 52, pages 19-28] and 30 ml of anhydrous tetrahydrofuran (THF) were introduced into a 250 ml flask: 0.37 g (3.3 mmoles) of potassium t-butoxide (t-BuOK) were then added, in small portions, to the solution obtained. The reaction mixture obtained was left, under stirring, at room temperature (25° C.), for the whole night. The reaction was then quenched by adding 30 ml of water and subsequently 30 ml of ethyl acetate (AcOEt) and the whole mixture was left, under stirring, for 1 hour and then extracted with dichloromethane (CH₂Cl₂) (3×20 ml). The organic phase obtained was washed with water (3×15 ml) and dried on sodium sulfate (Na₂SO₄). After eliminating the solvent by evaporation at reduced pressure, a yellow-orange-coloured residue was obtained, which was purified by means of flash chromatography on silica gel, using dichloromethane (CH₂Cl₂) as eluent, obtaining 0.10 g (yield 14%) of N,N-bis-{4-[N-methylpyrrol-2-yl)vin-2-yl]phenyl}-p-methoxyaniline (2), as a yellow-orange solid.

Said N,N-bis-{4-[N-methylpyrrol-2-yl)vin-2-yl]phenyl}-p-methoxyaniline (2) was characterized by means of ¹H-NMR (500 MHz; DMSO-d₆; Me₄Si) obtaining the following spectrum: $\delta_H$ 7.44 (4H, d, J=8.6 Hz), 7.06 (2H, J=8.9 Hz), 7.01 (2H, d, J=16.2 Hz), 6.95 (2H, d, J=8.9 Hz), 6.91 (4H, d, J=8.6 Hz), 6.80 (2H, d, J=16.2 Hz), 6.76 (2H, m), 6.42 (2H, m), 6.01 (2H, t), 3.77 (3H, s), 3.67 (6H, s).

Synthesis of N,N-bis-{4-[(5-formyl-N-methylpyrrol-2-yl)vin-2-yl]phenyl}-p-methoxyaniline (3)

0.37 g (0.50 mmoles) of dimethylformamide (DMF) were introduced into a 100 ml flask, previously anhydrified and maintained under a flow of nitrogen (N₂), and subsequently, after cooling to a temperature of −10° C., 0.80 g (0.50 mmoles) of phosphorous oxychloride (POCl₃) were slowly added dropwise: the immediate formation of a colourless solid was observed and after 30 minutes, 5 ml of 1,2-dichloroethane were added. After the complete dissolution of the reaction mixture, 0.10 g (0.21 mmoles) of N,N-bis-{4-[N-methylpyrrol-2-yl)vin-2-yl]phenyl}-p-methoxyaniline (2), obtained as described above, dissolved in 10 ml of 1,2-dichloroethane, were added. The reaction mixture was left under stirring, at room temperature (25° C.), for the whole night. The reaction was then quenched by adding 30 ml of a saturated aqueous solution of potassium carbonate (K₂CO₃) and the whole mixture was left, under stirring, for 1 hour and then extracted with dichloromethane (CH₂Cl₂) (3×20 ml). The organic phase obtained was washed with water (2×15 ml), filtered and dried on sodium sulfate (Na₂SO₄). After eliminating the solvent by evaporation at reduced pressure, 0.05 g (yield 43%) of N,N-bis-{4-[(5-formyl-N-methylpyrrol-2-yl)vin-2-yl]phenyl}-p-methoxyaniline (3) were obtained as a dark orange solid.

Said N,N-bis-{4-[(5-formyl-N-methylpyrrol-2-yl)vin-2-yl]phenyl}-p-methoxyaniline (3) was characterized by means of ¹H-NMR (500 MHz; DMSO-d₆; Me₄Si) obtaining the following spectrum: $\delta_H$ 9.45 (2H, s), 7.57 (4H, d, J 8.6), 7.25 (2H, d, J 16.1), 7.15 (2H, d, J 16.1), 7.09 (2H, d, J 8.9), 7.04 (2H, d, J 4.3), 7.01-6.95 (6H, m), 6.72 (2H, d, J 4.3), 4.00 (6H, s), 3.78 (3H, s).

Synthesis of the Compound (F1)

0.05 g (0.09 mmoles) of N,N-bis-{4-[(5-formyl-N-methylpyrrol-2-yl)vin-2-yl]phenyl}-p-methoxyaniline (3), obtained as described above, and 10 ml of chloroform (CHCl₃), were introduced into a 50 ml flask: 0.85 g (1.0 mmoles) of 2-cyanoacetic acid were then added to the solution obtained. The reaction mixture obtained was cooled to 0° C. with an ice bath and a solution of piperidine (0.102 g, 1.20 mmoles) in 5 ml of chloroform (CHCl₃) were subsequently slowly added dropwise. At the end of the dripping, the reaction mixture was heated to the reflux temperature of the solvent, for 8 hours. The reaction mixture was then left to cool to room temperature (25° C.) and the formation of a precipitate was observed, which was recovered by filtration at reduced pressure obtaining a dark red solid which was subsequently dissolved in 20 ml of water and treated with 10 ml of a solution of hydrochloric acid at 10%: in this phase, the formation of a dark precipitate was observed, which was in turn recovered by filtration at reduced pressure, washed with water (2×15 ml) and dried under vacuum obtaining 0.026 g (yield 56%) of the compound (F1) as a purple solid.

Said compound (F1) was characterized by means of ¹H-NMR (500 MHz; DMSO-d₆; Me₄Si) obtaining the following spectrum: $\delta_H$ 7.94 (2H, s), 7.57 (4H, d, J=8.9 Hz), 7.38 (2H, d, J=4.4 Hz), 7.23 (2H, d, J=16.2 Hz), 7.14 (2H, d, J=16.2 Hz), 7.02-6.94 (8H, m), 6.81 (2H, d, J=4.4 Hz), 4.00 (6H, s), 3.78 (3H, s).

Example 2

Preparation of the Compound F2

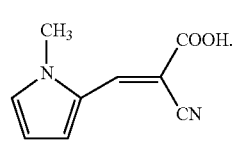

The compound F2 was obtained according to the following Scheme 2:

Scheme 2

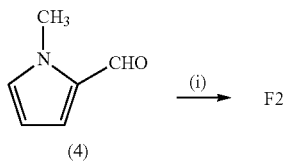

wherein: (i) indicates 2-cyanoacetic acid, piperidine, ethanol (EtOH).

Synthesis of the Compound (F2)

1.00 g (9.2 mmoles) of N-methylpyrrole-2-carboxyaldehyde and 10 ml of ethanol (EtOH) were introduced into a 50 ml flask. 0.77 g (9.1 mmoles) of 2-cyanoacetic acid were then added to the solution obtained. The reaction mixture obtained was cooled to 0° C. with an ice bath and a solution of piperidine (0.85 g, 10.0 mmoles) in 5 ml of chloroform ($CHCl_3$) were subsequently slowly added dropwise. At the end of the dripping, the reaction mixture was left under stirring at room temperature (25° C.), for 18 hours. After eliminating the solvent by evaporation at reduced pressure, a dark yellow oil was obtained, which was subsequently dissolved in 20 ml of water and treated with 10 ml of a solution of hydrochloric acid at 10%: in this phase, the formation of a bright yellow precipitate was observed, which was in turn recovered by filtration at reduced pressure, washed with water (2×15 ml) and dried under vacuum obtaining 1.27 g (yield 79%) of the compound (F2) as a bright yellow solid.

Said compound (F2) was characterized by means of $^1$H-NMR (500 MHz; DMSO-$d_6$) obtaining the following spectrum: $\delta_H$ 13.33 (1H, bs), 8.06 (1H, s), 7.47 (1H d), 7.39 (1H, bs), 6.39 (1H, bs), 3.80 (3H, s).

Example 3

Preparation of the Compound F3

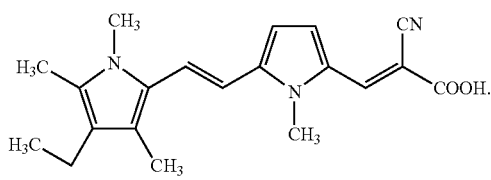

The compound F3 was obtained according to the following Scheme 3:

Scheme 3

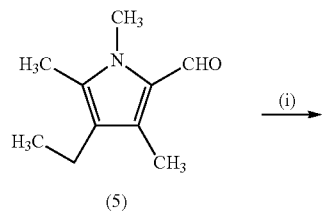

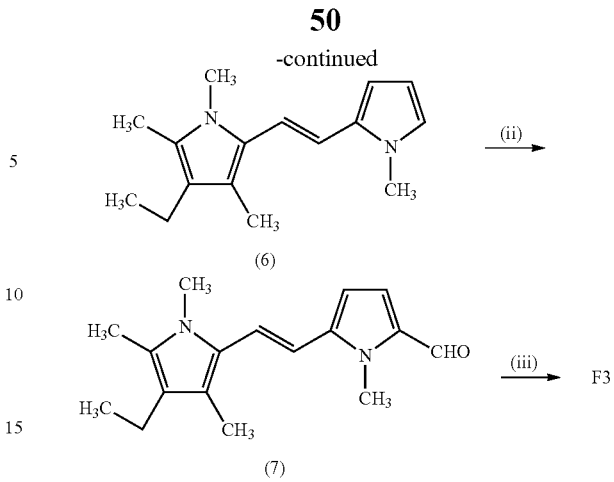

wherein: (i) indicates [(1-methyl-1-H-pyrrol-2-yl)methyl] triphenylphosphonium iodide, potassium t-butoxide (t-BuOK), anhydrous tetrahydrofuran (THF); (ii) indicates dimethylformamide (DMF), phosphorous oxychloride ($POCl_3$); (iii) indicates 2-cyanoacetic acid, piperidine, chloroform ($CHCl_3$).

Synthesis of (E)-3-ethyl-1,2,4-trimethyl-5-(2-(1-methyl-1H-pyrrol-2-yl)vinyl)-1H-pyrrole (6)

0.860 g (5.2 mmoles) of N-methyl-4-ethyl-3,5-dimethyl-1H-pyrrole-2-carbaldehyde (5) [obtained as described by D. Brown et al., in "*Journal of the Chemical Society, Perkin Transactions 1*" (1986), pages 455-463], 1.06 g (2.2 mmoles) of [(1-methyl-1-H-pyrrol-2-yl)methyl]triphenylphosphonium iodide [obtained as described by Rawal V. H. et al., in "*The Journal of Organic Chemistry*" (1987), Vol. 52, pages 19-28] and 30 ml of anhydrous tetrahydrofuran (THF) were introduced into a 250 ml flask: 0.28 g (2.5 mmoles) of potassium t-butoxide (t-BuOK) were then added, in small portions, to the solution obtained. The reaction mixture obtained was left, under stirring, at room temperature (25° C.), for the whole night. The reaction was then quenched by adding 30 ml of water and subsequently 30 ml of ethyl acetate (AcOEt) and the whole mixture was left, under stirring, for 1 hour and then extracted with dichloromethane ($CH_2Cl_2$) (3×20 ml). The organic phase obtained was washed with water (3×15 ml) and dried on sodium sulfate ($Na_2SO_4$). After eliminating the solvent by evaporation at reduced pressure, a yellow-orange-coloured residue was obtained, which was purified by means of flash chromatography on silica gel, using dichloromethane ($CH_2Cl_2$) as eluent, obtaining 0.30 g (yield 54%) of (E)-3-ethyl-1,2,4-trimethyl-5-(2-(1-methyl-1H-pyrrol-2-yl)vinyl)-1H-pyrrole (6), as a yellow-orange solid.

Said (E)-3-ethyl-1,2,4-trimethyl-5-(2-(1-methyl-1H-pyrrol-2-yl)vinyl)-1H-pyrrole (6) was characterized by means of $^1$H-NMR (500 MHz; DMSO-$d_6$) obtaining the following spectrum: $\delta_H$ 6.76 (1H, d, J=16.3 Hz), 6.71-6.68 (1H, m), 6.41 (1H, d, J=16.5 Hz), 6.35 (1H, m), 6.00-5.97 (1H, m), 3.60 (3H, s), 3.45 (3H, s), 2.34 (2H, q, J=7.4 Hz), 2.12 (3H, s), 2.09 (3H, s), 0.98 (3H, t, J=7.5 Hz).

Synthesis of (E)-5-(2-(4-ethyl-1,3,5-trimethyl-1H-pyrrol-2-yl)vinyl)-1-methyl-1H-pyrrole-2-carboxaldehyde (7)

0.10 g (1.36 mmoles) of dimethyl formamide (DMF) were introduced into a 100 ml flask, previously anhydrified and maintained under a flow of nitrogen (N₂), and subsequently, after cooling to a temperature of −10° C., 0.21 g (1.36 mmoles) of phosphorous oxychloride (POCl₃) were slowly added dropwise: the rapid formation of a colourless solid was observed and after 30 minutes, 10 ml of dimethyl formamide (DMF) were added. After the complete dissolution of the reaction mixture and after cooling to a temperature of −10° C., 0.30 g (1.24 mmoles) of (E)-3-ethyl-1,2,4-trimethyl-5-(2-(1-methyl-1H-pyrrol-2-yl)vinyl)-1H-pyrrole (6), obtained as described above, dissolved in ml of dimethyl formamide (DMF), were slowly added dropwise. The reaction mixture was left under stirring, at −10° C., for 10 minutes. The reaction was then quenched by adding 100 ml of a saturated aqueous solution of potassium carbonate (K₂CO₃) and the whole mixture was left, under stirring, for 1 hour, and then extracted with dichloromethane (CH₂Cl₂) (3×20 ml). The organic phase obtained was washed with water (2×15 ml), filtered and dried on sodium sulfate (Na₂SO₄). After eliminating the solvent by evaporation at reduced pressure, a yellow-orange-coloured residue was obtained, which was purified by means of flash chromatography on silica gel using dichloromethane/ethyl acetate (CH₂Cl₂/AcOEt) (95:5 v/v) as eluent, obtaining 0.20 g (yield 62%) of (E)-5-(2-(4-ethyl-1,3,5-trimethyl-1H-pyrrol-2-yl)vinyl)-1-methyl-1H-pyrrole-2-carboxaldehyde (7) as a dark orange solid.

Said (E)-5-(2-(4-ethyl-1,3,5-trimethyl-1H-pyrrol-2-yl)vinyl)-1-methyl-1H-pyrrole-2-carboxaldehyde (7) was characterized by means of ¹H-NMR (500 MHz; DMSO-d₆) obtaining the following spectrum: $\delta_H$ 9.45 (2H, s), 7.57 (4H, d, J=8.6 Hz), 7.25 (2H, d, J=16.1 Hz), 7.15 (2H, d, J=16.1 Hz), 7.09 (2H, d, J=8.9 Hz), 7.04 (2H, d, J=4.3 Hz), 7.01-6.95 (6H, m), 6.72 (2H, d, J=4.3 Hz), 4.00 (6H, s), 3.78 (3H, s) (some signals are covered by the signal of the solvent).

Synthesis of the Compound (F3)

0.10 g (0.37 mmoles) of (E)-5-(2-(4-ethyl-1,3,5-trimethyl-1H-pyrrol-2-yl)vinyl)-1-methyl-1H-pyrrole-2-carboxaldehyde (7), obtained as described above, and 10 ml of chloroform (CHCl₃) were introduced into a 50 ml flask: 0.32 g (3.7 mmoles) of 2-cyanoacetic acid were then added to the solution obtained. The reaction mixture obtained was cooled to 0° C. with an ice bath and a solution of piperidine (0.34 g, 4.0 mmoles) in 5 ml of chloroform (CHCl₃) were subsequently slowly added dropwise. At the end of the dripping, the reaction mixture was heated to the reflux temperature of the solvent, for 4 hours. The reaction mixture was then left to cool to room temperature (25° C.) and the formation of a precipitate was observed, which was recovered by filtration at reduced pressure obtaining a dark red solid which was subsequently dissolved in 20 ml of water and treated with 10 ml of a solution of hydrochloric acid at 10%: in this phase, the formation of a dark precipitate was observed, which was in turn recovered by filtration at reduced pressure, washed with water (2×15 ml) and dried under vacuum obtaining 0.08 g (yield 64%) of the compound (F3) as a purple solid.

Said compound (F3) was characterized by means of ¹H-NMR (500 MHz; DMSO-d₆) obtaining the following spectrum: $\delta_H$ 7.97 (1H, s), 7.61 (1H, bs), 7.30 (1H, d, J=15.6 Hz), 7.02 (1H, bs), 6.54 (1H, d, J=15.8 Hz), 3.72 (3H, s), 3.56 (3H, s), 2.17 (6H, bs), 0.99 (3H, m) (some signals are covered by the signal of the solvent).

Example 4

Preparation of the Compound F4

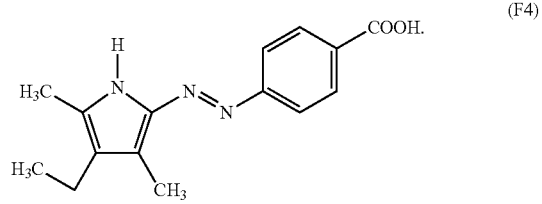 [SMILES: CCc1c(C)[nH]c(/N=N/c2ccc(C(=O)O)cc2)c1C]

The compound F4 was obtained according to the following Scheme 4:

Scheme 4

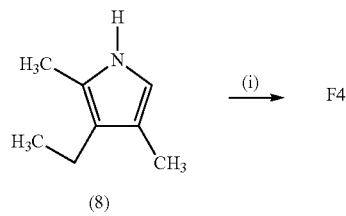

wherein: (i) indicates hydrochloric acid (HCl), sodium nitrite (NaNO₂), 4-amino benzoic acid, pyridine, water (H₂O), ethanol (EtOH).

Synthesis of the Compound F4

0.90 g (6.6 mmoles) of 4-amino benzoic acid were introduced into a 150 ml flask and suspended in 16 ml of water: 4 ml of hydrochloric acid at 37% were added to the suspension obtained. 0.50 g (7.2 mmoles) of sodium nitrite in 10 ml of water were added to the solution obtained, cooled to 0° C. with an ice bath and kept under magnetic stirring, obtaining a solution comprising a diazonium salt.

0.81 g (6.6 mmoles) of 3-ethyl-2,4-dimethylpyrrole and 6 ml of pyridine were dissolved, separately, in 60 ml of ethanol, in a 100 ml flask: the solution of diazonium salt prepared as described above was slowly added dropwise to the solution obtained, maintaining the temperature between 0° C. and 5° C. At the end of the dripping, the reaction mixture obtained was left to warm up to room temperature (25° C.) and kept under stirring for 18 hours. The reaction mixture was then concentrated by evaporation of the solvent at reduced pressure observing the formation of a precipitate which was filtered at reduced pressure obtaining a dark solid. The dark solid obtained was dissolved in 3 ml of acetic acid, precipitated by adding 20 ml of petroleum ether and filtered at reduced pressure obtaining 0.04 g (yield 2%) of compound (F4) as a dark solid.

Said compound (F4) was characterized by means of ¹H-NMR (500 MHz; CDCl₃) obtaining the following spectrum: $\delta_H$ 8.13 (2H, d, J=8.4 Hz), 7.3 (2H, d, J=8.5 Hz), 2.61 (3H, s), 2.49 (2H, q, J=8.2 Hz), 2.38 (3H, s), 0.88 (3H, t, J=6.8 Hz).

Example 5

Preparation of the Compound F5

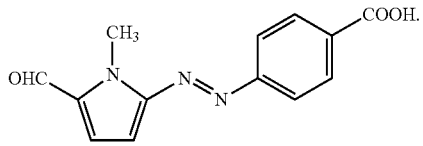

The compound F5 was obtained according to the following Scheme 5:

Scheme 5

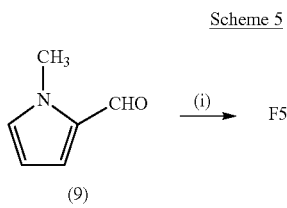

wherein: (i) indicates hydrochloric acid (HCl), sodium nitrite ($NaNO_2$), 4-amino benzoic acid, pyridine, water ($H_2O$), ethanol (EtOH).

Synthesis of the Compound F5

0.45 g (3.3 mmoles) of 4-amino benzoic acid were introduced into a 100 ml flask and suspended in 8 ml of water: 2 ml of hydrochloric acid at 37% were added to the suspension obtained. 0.25 g (3.6 mmoles) of sodium nitrite in 5 ml of water were added to the solution obtained, cooled to 0° C. with an ice bath and kept under magnetic stirring, obtaining a solution comprising a diazonium salt.

0.36 g (3.3 mmoles) of N-methylpyrrole-2-carboxyaldehyde and 3 ml of pyridine were dissolved, separately, in 30 ml of ethanol, in a 50 ml flask: the solution of diazonium salt prepared as described above was slowly added dropwise to the solution obtained, maintaining the temperature between 0° C. and 5° C. At the end of the dripping, the reaction mixture obtained was left to warm up to room temperature (25° C.) and kept under stirring for 18 hours. The reaction mixture was then concentrated by evaporation of the solvent at reduced pressure observing the formation of a precipitate which was filtered at reduced pressure obtaining a dark solid. The dark solid obtained was dissolved in 3 ml of acetic acid, precipitated by adding 20 ml of petroleum ether and filtered at reduced pressure obtaining 0.47 g (yield 57%) of compound (F5) as a dark solid.

Said compound (F5) was characterized by means of $^1$H-NMR (500 MHz; $CDCl_3$) obtaining the following spectrum which proved to contain two stereoisomers E and Z, which are indicated hereunder as A and B as signals could not be assigned to either structure:

Isomer A: $\delta_H$ 9.62 (1H, s), 8.18 (2H, d, J=8.2 Hz), 7.55 (2H, d, J=8.2 Hz), 7.01 (1H, d, J=4.1 Hz), 6.39 (1H, d, J=4.1 Hz), 3.97 (3H, s);

Isomer B: $\delta_H$ 9.75 (1H, s), 8.23 (2H, d, J=8.4 Hz), 7.95 (2H, d, J=8.2 Hz), 7.03 (1H, d, J=4.6 Hz), 6.76 (1H, d, J=4.5 Hz), 4.34 (3H, s).

Example 6

Preparation of a Dye Sensitized Solar Cell (DSSC)

The titanium dioxide ($TiO_2$) electrodes were prepared by the deposition (doctor blade technique) of a colloidal paste containing titanium dioxide ($TiO_2$) having a dimension of 20 nm ($TiO_2$ paste DSL 18NR-T-Dyesol) on FTO conductive glass (Hartford Glass Co., TEC 8, having a thickness of 2.3 mm and a sheet resistance of 6 $\Omega/cm^2$-9 $\Omega/cm^2$), previously cleaned with water and ethanol, treated with a plasma cleaner, at 100 W, for 10 minutes, immersed in a freshly prepared aqueous solution of titanium tetrachloride ($TiCl_4$ of Aldrich) ($4.5 \times 10^{-2}$ M), at 70° C., for 30 minutes, and finally washed with ethanol.

After a first drying at 125° C., for 15 minutes, a diffusion reflecting layer containing particles of titanium dioxide ($TiO_2$) with dimensions >100 nm (Ti-Nanoxide R/SP-Solaronix), was deposited (doctor blade technique) on the first layer of titanium dioxide ($TiO_2$) and sintered at 500° C., for 30 minutes. The glass coated with the film of titanium dioxide ($TiO_2$) was cooled to room temperature (25° C.) and immersed again in a freshly prepared aqueous solution of titanium tetrachloride ($TiCl_4$) ($4.5 \times 10^{-2}$ M), at 70° C., for 30 minutes, finally washed with ethanol and sintered again at 500° C., for 30 minutes, obtaining a final thickness of the electrode ranging from 8 μm to 12 μm.

After sintering, the glass coated with titanium dioxide ($TiO_2$) film, was cooled to about 80° C.-100° C. and immediately immersed in a solution in dichloromethane ($CH_2Cl_2$) ($5 \times 10^{-4}$ M) of the compound (F1) obtained as described in Example 1, at room temperature (25° C.), for 24 hours. The glass coated with coloured titania was washed with ethanol and dried at room temperature (25° C.), under a flow of nitrogen ($N_2$).

A Surlyn spacer having a thickness of 50 μm (TPS 065093-50-Dyesol) was used for sealing the photo-anode obtained as described above and the counter-electrode consisting of platinized FTO glass (Hartford Glass Co., TEC 8, having a thickness of 2.3 mm and a sheet resistance of 6 $\Omega/cm^2$-9 $\Omega/cm^2$). The cell was subsequently filled, through a hole previously prepared in the platinized FTO glass, with the commercial electrolyte solution HPE of Dyesol.

The active area of the cell, calculated by means of a microphotograph, was 0.1336 $cm^2$.

The photovoltaic performance of the cell was measured with a solar simulator (Abet 2000) equipped with a 300 W xenon light source, the light intensity was calibrated with a standard silicon solar cell ("VLSI Standard" SRC-1000-RTD-KGS), the current-voltage characteristics were obtained by applying an external voltage to the cell and measuring the photocurrent generated with a "Keithley 2602A" digital multimeter (3A DC, 10A Pulse). The following results were obtained:

Voc (open-circuit photovoltage)=0.59 V;
FF ("Fill Factor")=70.8%;
Jsc (short-circuit current density)=9.8 mA/$cm^2$;
η (photoelectric transformation efficiency): 4.1%.

The invention claimed is:

1. An organic dye having general formula (I):

wherein:
D represents a triarylamine group having the following general formulae (VIII):

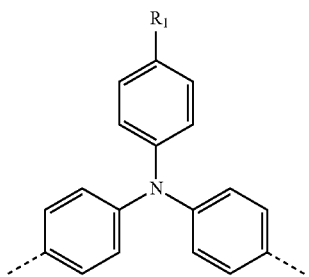

(VIII)

wherein $R_1$ is selected from linear or branched $C_1$-$C_{20}$ alkoxyl groups, q is 1;

P represents formulae (Ia):

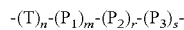

(Ia)

wherein:

T represents a double carbon-carbon bond having general formula (XXVIII) or (XXIX):

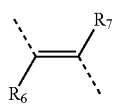

(XXVIII)

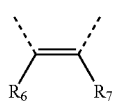

(XXIX)

wherein $R_6$ and $R_7$ each represent a hydrogen atom;

n is 1;

$P_1$ represents a bivalent pyrrole group having general formula (XXII):

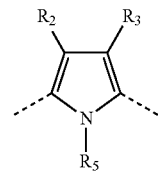

(XXII)

wherein:

$R_5$ is selected from linear or branched $C_1$-$C_{20}$ alkyl groups;

$R_2$ and $R_3$, the same as each other, represent a hydrogen atom;

m is 1 and r and s are 0;

A represents a carboxycyanovinylene group having general formula (XLIV):

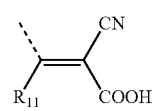

(XLIV)

wherein $R_{11}$ represents a hydrogen atom; and t is 2.

2. The organic dye according to claim 1, wherein $R_1$ is a methoxyl group and $R_5$ is a methyl group.

3. A dye-sensitized photoelectric transformation element, comprising at least one organic dye according to claim 1, said dye-sensitized photoelectric transformation element being supported on particles of a semiconductor oxide.

4. A dye-sensitized solar cell (DSSC) comprising the dye-sensitized photoelectric transformation element according to claim 3.

5. A dye-sensitized photoelectric transformation element, comprising at least one organic dye according to claim 2, said dye-sensitized photoelectric transformation element being supported on particles of a semiconductor oxide.

6. A dye-sensitized solar cell (DSSC) comprising the dye-sensitized photoelectric transformation element according to claim 5.

7. A compound of formula (F1):

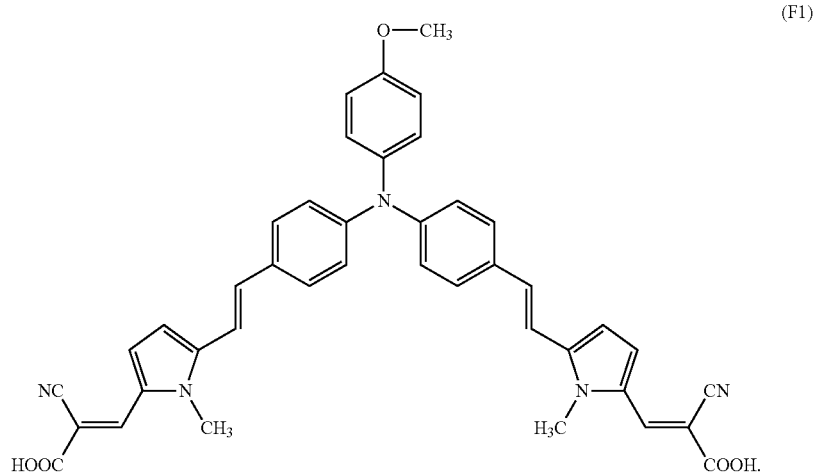 [SMILES: COc1ccc(N(c2ccc(/C=C/c3ccc(/C=C(\C#N)C(=O)O)n3C)cc2)c2ccc(/C=C/c3ccc(/C=C(\C#N)C(=O)O)n3C)cc2)cc1]

(F1)

8. A dye-sensitized photoelectric transformation element, comprising a compound of formula (F1) according to claim 7, said dye-sensitized photoelectric transformation element being supported on particles of a semiconductor oxide.

9. A dye-sensitized solar cell (DSSC) comprising the dye-sensitized photoelectric transformation element according to claim 8.

10. The dye-sensitized solar cell (DSSC) of claim 6, wherein said DSSC has a photoelectric transformation efficiency ($\eta$) higher than or equal to 3.5%.

11. The dye-sensitized solar cell (DSSC) of claim 4, wherein said DSSC has a photoelectric transformation efficiency ($\eta$) higher than or equal to 3.5%.

12. The dye-sensitized solar cell (DSSC) of claim 9, wherein said DSSC has a photoelectric transformation efficiency ($\eta$) higher than or equal to 3.5%.

* * * * *